United States Patent
Ookouchi et al.

(10) Patent No.: US 9,704,730 B2
(45) Date of Patent: Jul. 11, 2017

(54) SUBSTRATE CLEANING APPARATUS, SUBSTRATE CLEANING METHOD AND NON-TRANSITORY STORAGE MEDIUM

(71) Applicant: Tokyo Electron Limited, Tokyo (JP)

(72) Inventors: Atsushi Ookouchi, Koshi (JP); Kousuke Yoshihara, Koshi (JP); Hiroshi Ichinomiya, Koshi (JP); Hirosi Nisihata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 542 days.

(21) Appl. No.: 14/283,331

(22) Filed: May 21, 2014

(65) Prior Publication Data

US 2014/0352737 A1    Dec. 4, 2014

(30) Foreign Application Priority Data

May 28, 2013  (JP) .................................. 2013-112395
Jan. 29, 2014  (JP) .................................. 2014-014864
Mar. 20, 2014  (JP) .................................. 2014-058221

(51) Int. Cl.
*H01L 21/67*  (2006.01)
*B08B 3/00*   (2006.01)
*B08B 7/00*   (2006.01)

(52) U.S. Cl.
CPC .............................. *H01L 21/67051* (2013.01)

(58) Field of Classification Search
CPC ........... H01L 21/67051; H01L 21/6704; H01L 67/028
See application file for complete search history.

(56) References Cited

U.S. PATENT DOCUMENTS

| | | | |
|---|---|---|---|
| 7,837,804 B2 | 11/2010 | Ohno et al. | |
| 2008/0251101 A1* | 10/2008 | Ohno | B08B 3/02 134/4 |
| 2009/0050175 A1* | 2/2009 | Tanaka | H01L 21/67051 134/1 |
| 2009/0250079 A1* | 10/2009 | Yoshihara | B08B 3/024 134/4 |
| 2010/0307543 A1* | 12/2010 | Sekiguchi | B08B 3/02 134/94.1 |

(Continued)

FOREIGN PATENT DOCUMENTS

| | | |
|---|---|---|
| JP | 2004-014972 A | 1/2004 |
| JP | 4040074 B2 | 11/2007 |

(Continued)

*Primary Examiner* — Alexander Markoff
(74) *Attorney, Agent, or Firm* — Posz Law Group, PLC

(57) ABSTRACT

A cleaning liquid and a gas are discharged in sequence to a central portion of a substrate while the substrate is being rotated, and after nozzles that discharge them are moved to a peripheral edge side of the substrate, discharge of the cleaning liquid is switched to a second cleaning liquid nozzle set at a position deviated from a movement locus of the first cleaning liquid nozzle. Both of the nozzles are moved toward the peripheral edge side of the substrate while discharging the cleaning liquid and discharging the gas so that a difference between a distance from the discharge position of the second cleaning liquid nozzle to the central portion of the substrate and a distance from the discharge position of the gas nozzle to the central portion of the substrate gradually decreases.

6 Claims, 41 Drawing Sheets

(56) References Cited

U.S. PATENT DOCUMENTS

| | | | | |
|---|---|---|---|---|
| 2011/0308549 A1* | 12/2011 | Minami | ............ | H01L 21/02052 |
| | | | | 134/18 |
| 2011/0315169 A1* | 12/2011 | Minami | ............ | H01L 21/67051 |
| | | | | 134/30 |
| 2012/0006361 A1* | 1/2012 | Miyagi | ............. | H01L 21/67028 |
| | | | | 134/30 |
| 2012/0234362 A1* | 9/2012 | Yoshihara | ................ | B08B 3/024 |
| | | | | 134/33 |
| 2012/0247506 A1* | 10/2012 | Tanaka | .............. | H01L 21/02052 |
| | | | | 134/4 |
| 2013/0174873 A1* | 7/2013 | Yoshihara | ................ | H05K 3/26 |
| | | | | 134/19 |
| 2014/0259728 A1* | 9/2014 | Ishibashi | ........... | H01L 21/02074 |
| | | | | 34/381 |
| 2014/0261569 A1* | 9/2014 | Fonseca | ............ | H01L 21/67051 |
| | | | | 134/30 |

FOREIGN PATENT DOCUMENTS

| | | | |
|---|---|---|---|
| JP | 4350989 | B2 | 7/2009 |
| JP | 5151629 | B2 | 12/2012 |

\* cited by examiner (a)

(b)

SUBSTRATE CLEANING APPARATUS, SUBSTRATE CLEANING METHOD AND NON-TRANSITORY STORAGE MEDIUM

BACKGROUND OF THE INVENTION

1. Field of the Invention

The present invention relates to a technical field of cleaning a front surface of a substrate with a cleaning liquid while rotating the substrate.

This application is based upon and claims the benefit of priority of the prior Japanese Patent Application No. 2013-112395, filed in Japan on May 28, 2013, the prior Japanese Patent Application No. 2014-014864, filed in Japan on Jan. 29, 2014, and the prior Japanese Patent Application No. 2014-058221, filed in Japan on Mar. 20, 2014, the entire contents of which are incorporated herein by reference.

2. Description of the Related Art

As exposure processing for forming a resist pattern on a substrate such as a semiconductor wafer, there is a known liquid-immersion exposure of performing exposure by making liquid exist on the front surface of the substrate. As a resist used for the liquid-immersion exposure, a high water repellent resist is used so as not to flow around to the peripheral edge and the rear surface of the substrate. In a developing treatment to be performed on the exposed substrate, a developing solution is supplied to the substrate to dissolve, for example, an exposed portion, and then a cleaning liquid such as pure water is supplied to the substrate while the substrate is being rotated to wash away a dissolution product from the front surface of the substrate. Concretely, a technique of scanning a cleaning liquid nozzle from a central portion of the substrate to the peripheral edge portion of the substrate while discharging the cleaning liquid from the cleaning liquid nozzle.

However, since a base film on which the resist is formed has low water repellency (small contact angle), the difference in contact angle between the exposed portion and an unexposed portion is large on the exposed substrate for which the resist having high water repellency (large contact angle) is used. Therefore, when the cleaning liquid is supplied after the developing solution is supplied, a phenomenon of so-called "liquid break" occurs and liquid drops become likely to remain on the front surface of the substrate. The liquid drops dry up to form residues, causing a reduction in yield of semiconductor devices.

As the base film, an anti-reflection film made of an organic material has been the mainstream, but an anti-reflection film made of an inorganic material having a smaller contact angle is discussed recently in which case the difference in contact angle between the exposed portion and the unexposed portion becomes larger and more likely to causes residues.

In the case of performing the above cleaning on the substrate having a large difference in contact angle between the exposed portion and the unexposed portion, it is effective to decrease the scan speed of the cleaning liquid nozzle, but the decrease causes a reduction in throughput of the apparatus. Since the coating and developing apparatus, in particular, is required to treat 200 or more substrates per hour in the market, a technique capable of reducing the residues while keeping a high throughput is desired.

As a cleaning method to solve the problem, Japanese Patent No. 4040074 describes a technique of discharging a cleaning liquid to a substrate and then discharging a nitrogen gas to a central portion of the substrate to form a core of a dry region, and thereafter, while moving the discharge position of the cleaning liquid to the outer side of the substrate, also moving the discharge position of the gas to spread the dry region to the outer side. In the technique, at the time when moving the discharge position of the gas, the moving speed of the gas nozzle is increased in a region on the peripheral edge side of the substrate. Japanese Patent Application Laid-open No. 2004-14972 (paragraph 0044) describes a technique of, when cleaning a substrate, changing the flow rate of a gas contained in a mixture of a liquid and the gas to be discharged toward the substrate as it gets closer to the peripheral edge portion of the substrate. Further, Japanese Patent No. 4350989 (FIG. 5, paragraphs 0050, 0053, 0057) describes a technique of increasing a spray angle of a gas to weaken the pressure of the gas as it gets closer to the peripheral edge of the substrate so as to uniformly dry. Further, Japanese Patent No. 5151629 (FIG. 4 to FIG. 6) describes a technique of discharging a gas toward a region of a substrate from one nozzle, and then discharging a gas toward the same region from another nozzle. In the future, it is predicted that a higher cleaning accuracy is required, and further improvements are demanded in order to reduce the residues.

SUMMARY OF THE INVENTION

The present invention has been made under the above circumstances, and its object is to, when cleaning a front surface of a substrate with a cleaning liquid while rotating the substrate, suppress the remnant of liquid drops after a cleaning treatment to reduce residues.

The present invention is a substrate cleaning apparatus for cleaning a substrate using a cleaning liquid and a gas while rotating the substrate, including:

a substrate holding unit that horizontally holds the substrate;

a rotation mechanism that rotates the substrate holding unit around a vertical axis;

a first cleaning liquid nozzle and a second cleaning liquid nozzle each configured to supply the cleaning liquid to the substrate held on the substrate holding unit;

a gas nozzle that discharges the gas to the substrate held on the substrate holding unit;

a nozzle moving unit configured to move the first cleaning liquid nozzle, the second cleaning liquid nozzle, and the gas nozzle; and a control unit that outputs control signals to execute steps of: discharging the cleaning liquid from the first cleaning liquid nozzle to a central portion of the substrate; then moving a discharge position of the cleaning liquid from the central portion of the substrate to a peripheral edge side and thereafter discharging the gas from the gas nozzle to the central portion; subsequently moving discharge positions of the first cleaning liquid nozzle and the gas nozzle toward the peripheral edge side of the substrate while discharging the cleaning liquid and the gas from the first cleaning liquid nozzle and the gas nozzle respectively; and then switching discharge of the cleaning liquid from the first cleaning liquid nozzle to a second cleaning liquid nozzle, and moving discharge positions of the second cleaning liquid nozzle and the gas nozzle toward the peripheral edge side of the substrate while discharging the cleaning liquid from the second cleaning liquid nozzle and the gas from the gas nozzle, wherein the discharge position of the second cleaning liquid nozzle is set at a position deviated from a movement locus of the discharge position of the first cleaning liquid nozzle, and wherein where a distance from the discharge position of the second cleaning liquid nozzle to the central portion of the substrate is d2, and a distance from the discharge position of the gas nozzle to the central portion of the substrate is d3, when the cleaning liquid is being discharged from the second cleaning liquid nozzle, d3<d2 and a difference between d2 and d3 gradually decreases with movement of the second cleaning liquid nozzle to the peripheral edge side of the substrate.

The present invention according to another aspect is a substrate cleaning apparatus for cleaning a substrate using a cleaning liquid and a gas while rotating the substrate, including:

a substrate holding unit that horizontally holds the substrate;

a rotation mechanism that rotates the substrate holding unit around a vertical axis;

a first nozzle moving unit that holds a cleaning liquid nozzle configured to supply the cleaning liquid and a gas nozzle configured to discharge the gas, to the substrate held on the substrate holding unit;

a second nozzle moving unit that holds a gas nozzle configured to discharge the gas to the substrate held on the substrate holding unit and is different from the first nozzle moving unit; and a control unit that outputs control signals to execute steps of discharging the cleaning liquid from the cleaning liquid nozzle to a central portion of the substrate; then moving the first nozzle moving unit and discharging the gas from the gas nozzle on the first gas nozzle moving unit to the central portion; subsequently moving the first nozzle moving unit toward a peripheral edge side of the substrate while discharging the cleaning liquid and discharging the gas from the gas nozzle on the first nozzle moving unit in a state that a discharge position of the cleaning liquid nozzle is located closer to the peripheral edge side of the substrate than is a discharge position of the gas nozzle on the first nozzle moving unit; and then moving the first nozzle moving unit and the second nozzle moving unit to the peripheral edge side of the substrate while discharging the gas from the gas nozzle on the second nozzle moving unit and the cleaning liquid from the cleaning liquid nozzle, wherein where a distance from the discharge position of the cleaning liquid nozzle to the central portion of the substrate is L1, and a distance from the discharge position of the gas nozzle on the second nozzle moving unit to the central portion of the substrate is L2, when the gas is being discharged from the gas nozzle on the second nozzle moving unit, L2<L1 and moving speeds of both of the nozzle moving units are controlled so that a difference between L1 and L2 gradually decreases with movement of the first nozzle moving unit and the second nozzle moving unit to the peripheral edge side of the substrate.

According to still another aspect, the present invention is a substrate cleaning method of cleaning a substrate using a cleaning liquid and a gas while rotating the substrate, including the steps of horizontally holding the substrate on a substrate holding unit;

discharging the cleaning liquid from a first cleaning liquid nozzle to a central portion of the substrate while rotating the substrate holding unit around a vertical axis;

then moving a discharge position of the cleaning liquid to a peripheral edge side of the substrate and thereafter discharging the gas from a gas nozzle to the central portion of the substrate;

subsequently moving discharge positions of the first cleaning liquid nozzle and the gas nozzle toward the peripheral edge side of the substrate while discharging the cleaning liquid and the gas from the first cleaning liquid nozzle and the gas nozzle respectively; and then switching discharge of the cleaning liquid from the first cleaning liquid nozzle to a second cleaning liquid nozzle, and moving discharge positions of the second cleaning liquid nozzle and the gas nozzle toward the peripheral edge side of the substrate while discharging the cleaning liquid from the second cleaning liquid nozzle and discharging the gas from the gas nozzle, wherein the discharge position of the second cleaning liquid nozzle is set at a position deviated from a movement locus of the discharge position of the first cleaning liquid nozzle, and wherein where a distance from the discharge position of the second cleaning liquid nozzle to the central portion of the substrate is d2, and a distance from the discharge position of the gas nozzle to the central portion of the substrate is d3, when the cleaning liquid is being discharged from the second cleaning liquid nozzle, d3<d2 and a difference between d2 and d3 gradually decreases with movement of the second cleaning liquid nozzle to the peripheral edge side of the substrate.

According to yet another aspect, the present invention is a substrate cleaning method of cleaning a substrate using a cleaning liquid and a gas while rotating the substrate, including the steps of:

by using a first nozzle moving unit that holds a cleaning liquid nozzle configured to supply the cleaning liquid to the substrate and a gas nozzle configured to discharge the gas, and a second nozzle moving unit that holds a gas nozzle configured to discharge the gas to the substrate and is different from the first nozzle moving unit, horizontally holding the substrate on a substrate holding unit;

discharging the cleaning liquid from the cleaning liquid nozzle to a central portion of the substrate while rotating the substrate holding unit around a vertical axis;

then moving the first nozzle moving unit and discharging the gas from the gas nozzle on the first gas nozzle moving unit to the central portion;

subsequently moving the first nozzle moving unit toward a peripheral edge side of the substrate while discharging the cleaning liquid and discharging the gas from the gas nozzle on the first nozzle moving unit in a state that a discharge position of the cleaning liquid nozzle is located closer to the peripheral edge side of the substrate than is a discharge position of the gas nozzle on the first nozzle moving unit; and then moving the first nozzle moving unit and the second nozzle moving unit to the peripheral edge side of the substrate while discharging the gas from the gas nozzle on the second nozzle moving unit and the cleaning liquid from the cleaning liquid nozzle, wherein where a distance from the discharge position of the cleaning liquid nozzle to the central portion of the substrate is L1, and a distance from the discharge position of the gas nozzle on the second nozzle moving unit to the central portion of the substrate is L2, when the gas is being discharged from the gas nozzle on the second nozzle moving unit, L2<L1 and moving speeds of both of the nozzle moving units are controlled so that a difference between L1 and L2 gradually decreases with movement of the first nozzle moving unit and the second nozzle moving unit to the peripheral edge side of the substrate.

According to further another aspect, the present invention is a non-transitory storage medium storing a program running on a computer of a substrate cleaning apparatus to cause the substrate cleaning apparatus to perform the substrate cleaning method.

In the present invention, a cleaning liquid and a gas are discharged in sequence to a central portion of a substrate using a cleaning liquid nozzle and a gas nozzle while the substrate is being rotated, and after both of the nozzles are moved to a peripheral edge side of the substrate, discharge of the cleaning liquid is switched to a second cleaning liquid nozzle set at a position deviated from a movement locus of the first cleaning liquid nozzle. Then, both of the nozzles are moved toward the peripheral edge side of the substrate while discharging the cleaning liquid and discharging the gas so that a difference between a distance from the discharge position of the second cleaning liquid nozzle to the central portion of the substrate and a distance from the discharge position of the gas nozzle to the central portion of the substrate gradually decreases. Therefore, the discharge position of the gas gradually gets closer to the liquid interface in the region on the peripheral edge side of the substrate. Accordingly, the force pushing the liquid interface by the gas becomes stronger in a region closer to the peripheral edge of the substrate to increase the cleaning effect, thereby suppressing the liquid remnant and liquid break of the cleaning liquid and performing excellent cleaning.

Further, in the present invention according to another aspect, a cleaning liquid and a gas for drying are discharged in sequence to a central portion of a substrate while the substrate is being rotated, and thereafter the cleaning liquid is discharged from a cleaning liquid nozzle provided on one nozzle moving unit and the gas is discharged from a gas nozzle provided on another nozzle moving unit. Then, when the nozzle moving units are moved to the peripheral edge side of the substrate, their moving speeds are made different so that the discharge position of the gas gets gradually closer to the liquid interface. Accordingly, the force pushing the liquid interface by the gas becomes stronger in a region closer to the peripheral edge of the substrate to obtain the same cleaning effect.

DETAILED DESCRIPTION OF THE INVENTION

Figure 1:
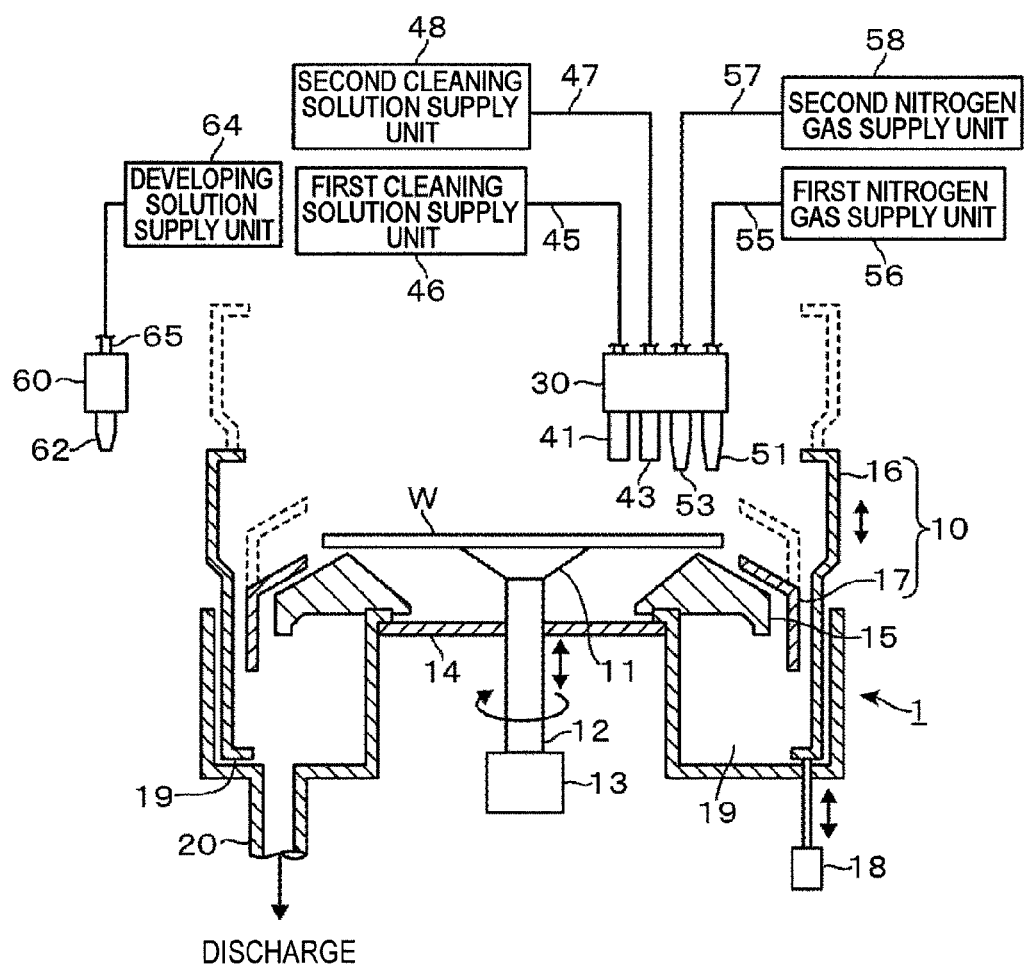
FIG. 1 is a longitudinal sectional view illustrating a substrate cleaning apparatus according to a first embodiment.

An embodiment in which a substrate cleaning apparatus of the present invention is applied to a developing apparatus will be described using FIG. 1 to FIG. 4. In the developing apparatus (substrate cleaning apparatus), two cup modules 1 are arranged side by side in a square-shaped housing 9. The cup module 1 includes a spin chuck 11 being a substrate holding unit that holds a wafer W and a cup body 10 for catching a cleaning liquid and a dissolved material scattering from a wafer W. The spin chuck 11 is connected to a rotation mechanism 13 and a not-illustrated raising and lowering mechanism via a rotation shaft 12, and is configured to be capable of rotating and rising and lowering while holding the wafer W thereon. Note that the wafer W is rotated clockwise viewed from above in the embodiment.

Below the spin chuck 11, a circular plate 14 and a ring member 15 are provided. Further, the cup body 10 with the upper side open is provided in a fashion to surround the wafer W on the spin chuck 11. The cup body 10 is composed of an outer cup 16 and an inner cup 17 both of which are cylindrical. The outer cup 16 is provided with a raising and lowering mechanism 18 and configured to freely rise and lower. Below the cup body 10, a liquid receiving part 19 configured to be an annular recessed part. A developing solution or the cleaning liquid that falls from the wafer W or is spun off and is then received by the cup body 10 flows into the liquid receiving part 19, and then discharged to the outside from a drain discharge port 20 provided at the bottom portion of the liquid receiving part 19.

Figure 2:
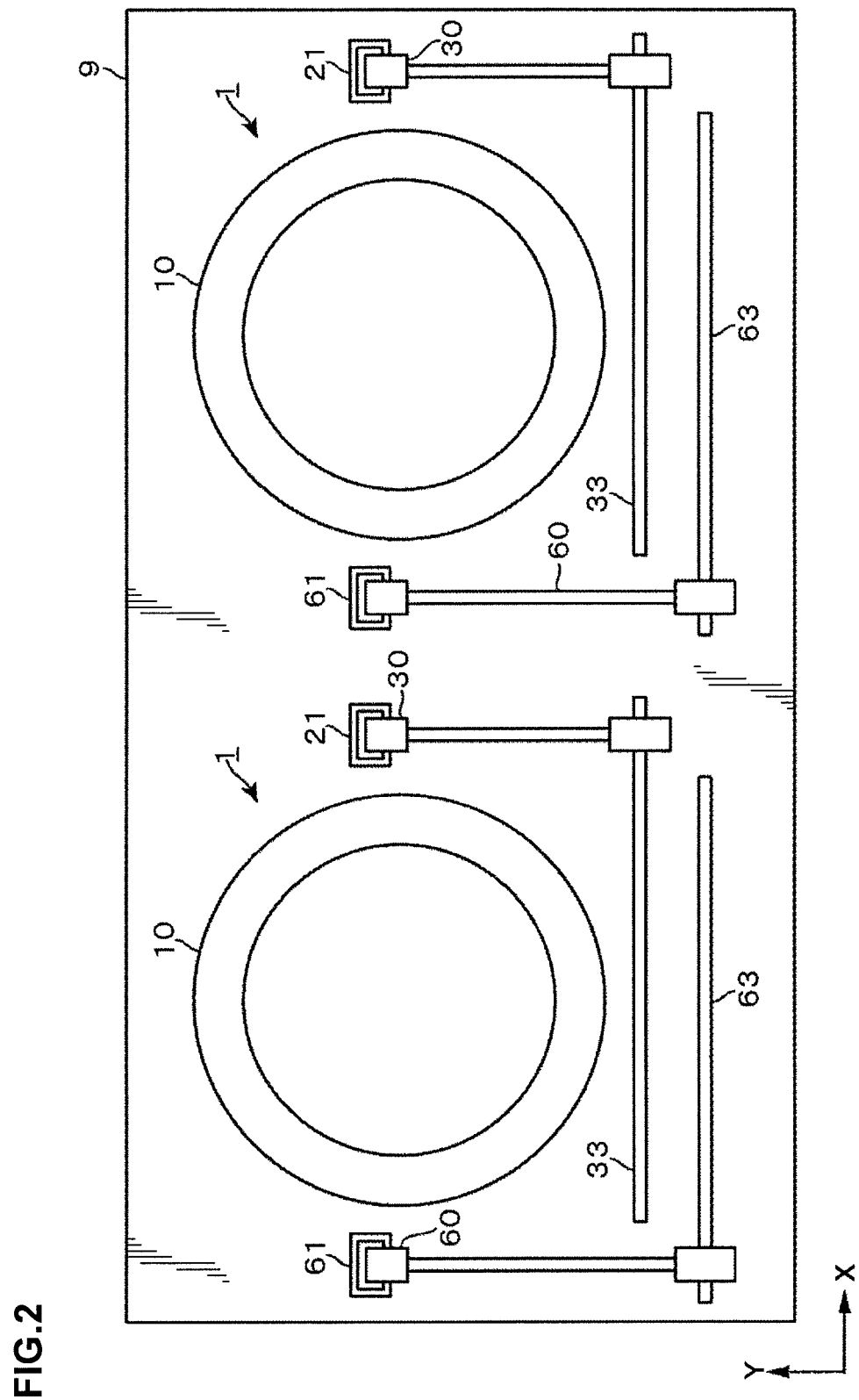
FIG. 2 is a plan view illustrating the substrate cleaning apparatus according to the first embodiment.

As illustrated in FIG. 2, a nozzle arm 60 for development and a nozzle arm 30 for cleaning which extend in a direction perpendicular to the arrangement direction (right-left direction) of the cup modules 1 are provided for each of the cup modules 1 in the housing 9. The nozzle arm 60 for development is configured to be movable by means of a not-illustrated drive unit along a guide rail 63 extending in the arrangement direction (right-left direction) of the cup module 1 and to freely rise and lower by means of a not-illustrated raising and lowering unit. At the tip portion of the nozzle arm 60 for development, a developing solution nozzle 62 is provided and is moved by the nozzle arm 60 for development between the rotation center portion of the spin chuck 11 and a nozzle bath 61 located closer to the left in FIG. 2 from the cup module 1. The developing solution nozzle 62 is connected to a developing solution supply unit 64 via a pipe 65, and is configured to be able to discharge the developing solution at a predetermined flow rate from the tip of the developing solution nozzle 62.

Figure 3:
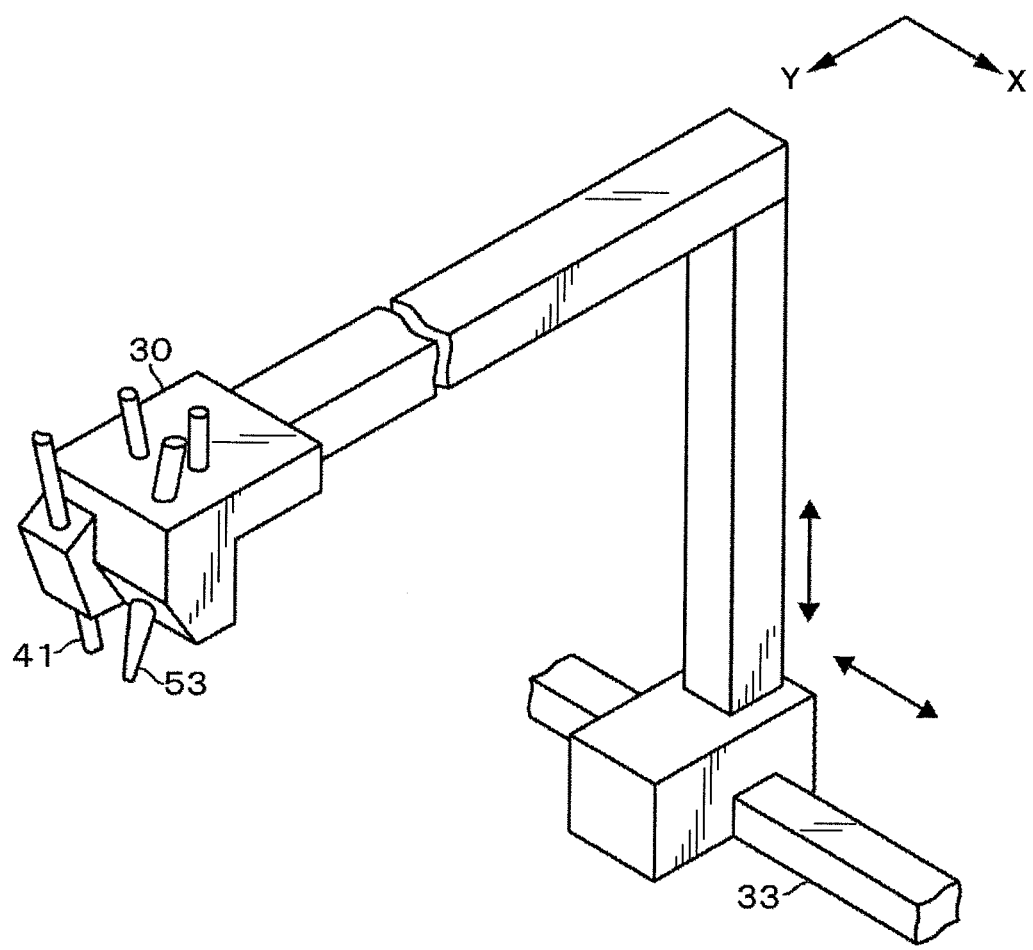
FIG. 3 is a perspective view illustrating a configuration of a nozzle arm.

Further, the nozzle arm 30 for cleaning (hereinafter, described as a "nozzle arm") is configured to be movable by means of a not-illustrated drive unit along a guide rail 33 extending in the right-left direction as illustrated in FIG. 3 and to freely rise and lower by means of a not-illustrated raising and lowering unit. The nozzle arm 30, the above-described drive unit and raising and lowering unit provided at the nozzle arm 30 constitute a nozzle moving unit. At the tip portion of the nozzle arm 30, a first cleaning liquid nozzle 41 and a second cleaning liquid nozzle 43 that discharge the cleaning liquid such as pure water, and a first nitrogen gas nozzle 51 and a second nitrogen gas nozzle 53 being gas nozzles that discharge, for example, a nitrogen gas being a gas for drying are provided as illustrate in FIG. 4. These nozzles 41, 43, 51, 53 are moved between a region above the cup module 1 and a waiting region located closer to the right in FIG. 2 from the cup module 1. In the waiting region, a nozzle bath 21 is provided which is a liquid receiving unit for the cleaning liquid nozzles 41, 43.

The first cleaning liquid nozzle 41 is connected to a first cleaning liquid supply unit 46 via, for example, a pipe 45. The first cleaning liquid supply unit 46 is provided with a cleaning liquid supply source, a pump, a valve and so on, and is configured to be able to discharge the cleaning liquid from the tip of the first cleaning liquid nozzle 41. The second cleaning liquid nozzle 43 is also connected to a second cleaning liquid supply unit 48 via a pipe 47 similarly to the first cleaning liquid nozzle 41, and can discharge the cleaning liquid from the second cleaning liquid nozzle 43. The first nitrogen gas nozzle 51 is connected to a first nitrogen gas supply unit 56 provided with a nitrogen gas supply source, a pump, a valve and so on via a pipe 55. The first nitrogen gas nozzle 51 is configured to be able to discharge a nitrogen gas. The second nitrogen gas nozzle 53 is also connected to a second nitrogen gas supply unit 58 provided with a nitrogen gas supply source, a pump, a valve and so on via a pipe 57.

The arrangement of the first cleaning liquid nozzle 41, the second cleaning liquid nozzle 43, the first nitrogen gas nozzle 51 and the second nitrogen gas nozzle 53 at the nozzle arm 30 will be described. Note that for convenience in the following description, the cleaning liquids to be discharged from the first cleaning liquid nozzle 41 and the second cleaning liquid nozzle 43 are described as a first cleaning liquid and a second cleaning liquid respectively, and the nitrogen gasses discharged from the first nitrogen gas nozzle 51 and the second nitrogen gas nozzle 53 are described as a first nitrogen gas and a second nitrogen gas respectively. Further, a later-described "discharge position" refers to an almost central portion of a discharge region on the wafer W when the cleaning liquid discharged from the cleaning liquid nozzle (41, 43) or the gas discharged from the gas nozzle (51, 53) to the front surface of the wafer W. Further, when the discharge position is expressed by X, Y coordinates, the central portion of the wafer W is regarded as an origin, the axis extending in an X-direction is regarded as an X-axis, the axis extending in a Y-direction is regarded as a Y-axis, and the right side and the upper side is a "positive region" in later-described FIG. 6 to FIG. 10.

The first cleaning liquid nozzle 41 is provided such that when its discharge position R1 is located at a position of X=30 mm, Y=0 mm, a discharge position N1 of the first nitrogen gas nozzle 51 is located at X=15 mm, Y=0 mm. The second cleaning liquid nozzle 43 is provided such that when the discharge position R1 of the first cleaning liquid nozzle 41 is located at X=30 mm, Y=0 mm, its discharge position R2 is located at a position that is obtained by rotating the discharge position R1 of the first cleaning liquid nozzle 41 clockwise about the central portion of the wafer W, for example, at a position of X=26 mm, Y=−15 mm. The second nitrogen gas nozzle 53 is set such that when the discharge position N1 of the first nitrogen gas nozzle 51 is located at X=15 mm, Y=0 mm, its discharge position N2 is located at a position that is obtained by rotating the discharge position N1 of the first nitrogen gas nozzle 51 anticlockwise about the central portion of the wafer W and where its distance from the X-axis is shorter than the distance of the discharge position R2 of the second cleaning liquid nozzle 43 from the X-axis. In this example, the discharge position N2 of the second nitrogen gas nozzle 53 is set to perform discharge, for example, to a position of X=13 mm, Y=7.5 mm. Further, the second nitrogen gas nozzle 53 is provided to perform discharge toward a direction of a peripheral edge of the wafer W, and the first cleaning liquid nozzle 41, the second cleaning liquid nozzle 43, and the first nitrogen gas nozzle 51 are provided to perform discharge toward directly below. The height of the discharge tip portion of the first nitrogen gas nozzle 51 is set at a height of 25 mm above the front surface of the wafer W, and the height of the discharge tip portion of the second nitrogen gas nozzle 53 is set at a height of 5 mm above the front surface of the wafer W.

Figure 5:
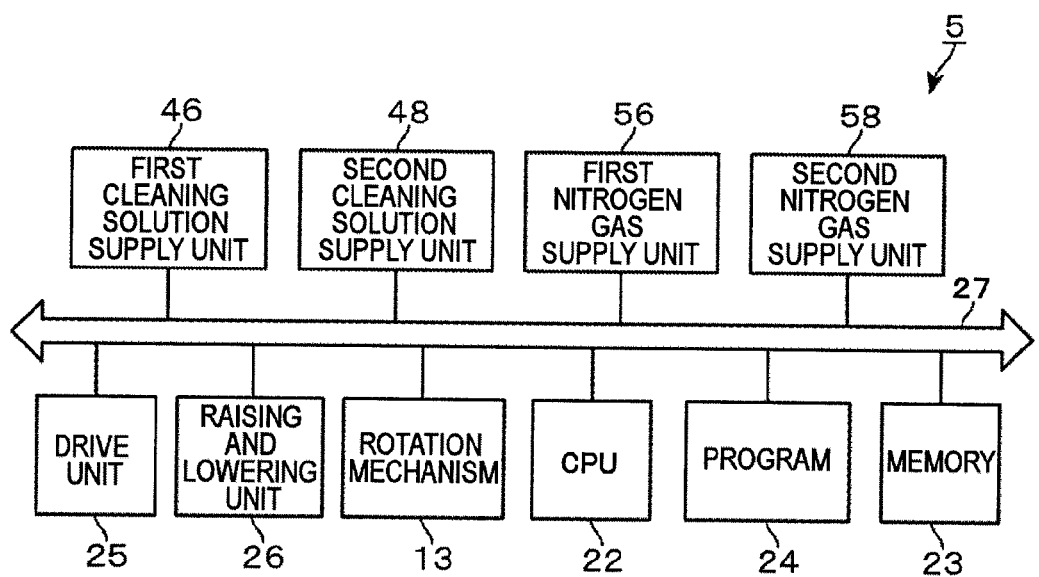
FIG. 5 is an explanatory view illustrating a configuration of a control unit according to the first embodiment.

Further, the substrate cleaning apparatus includes a control unit 5 as illustrated in FIG. 5. A numeral 27 in FIG. 5 denotes a bus, and a CPU 22, a memory 23, and a program 24 for executing steps in a later-described operation performed by the substrate cleaning apparatus are connected to the bus 27. A numeral 25 in FIG. 5 denotes the drive unit provided at the nozzle moving unit, a numeral 26 denotes the raising and lowering unit provided at the nozzle moving unit. The control unit 5 outputs, based on the program 24, control signals for controlling the drive unit and the raising and lowering unit for moving the nozzle arm 30, the cleaning liquid supply units 46, 48, the nitrogen gas supply units 56, 58, the rotation mechanism 13 for driving the spin chuck 11, and the raising and lowering mechanism 18 for the cup body 10. Further, the program is stored in a storage medium such as a compact disk, a hard disk, a magneto-optical disk and installed into the control unit 5.

Next, the operation of a first embodiment will be described. For example, the wafer W subjected to exposure processing is delivered by a not-illustrated external transfer mechanism to the spin chuck 11 such that the central portion of the wafer W coincides with the rotation center. Then, the outer cup 16 is raised, the wafer W is rotated at a rotation speed, for example, of 1000 rpm, and the developing solution nozzle 62 is located above the peripheral edge of the wafer W. Thereafter, while the wafer W is kept rotated, the developing solution nozzle 62 is moved from the outside of the wafer W toward the central portion while discharging the developing solution, and then continues to discharge the developing solution to the central portion for a predetermined time. When the developing solution is supplied, for example, a soluble region of a resist film on the front surface of the wafer W dissolves and an insoluble region remains. Thereafter, the nozzle arm 30 is moved to replace the developing solution nozzle 62, and a cleaning process for removing the developing solution and the dissolved material is performed. The cleaning process will be described in detail referring to FIG. 6 to FIG. 13. The cleaning process is performed by the following steps. FIG. 6 to FIG. 10 schematically express the nozzle arm 30 and the discharge positions of the cleaning liquids and the nitrogen gasses discharge from the nozzles 41, 43, 51, 53, and the discharge positions of the cleaning liquid and the nitrogen gas where discharges are being performed are given hatching.

(Step 1)

Figure 6:
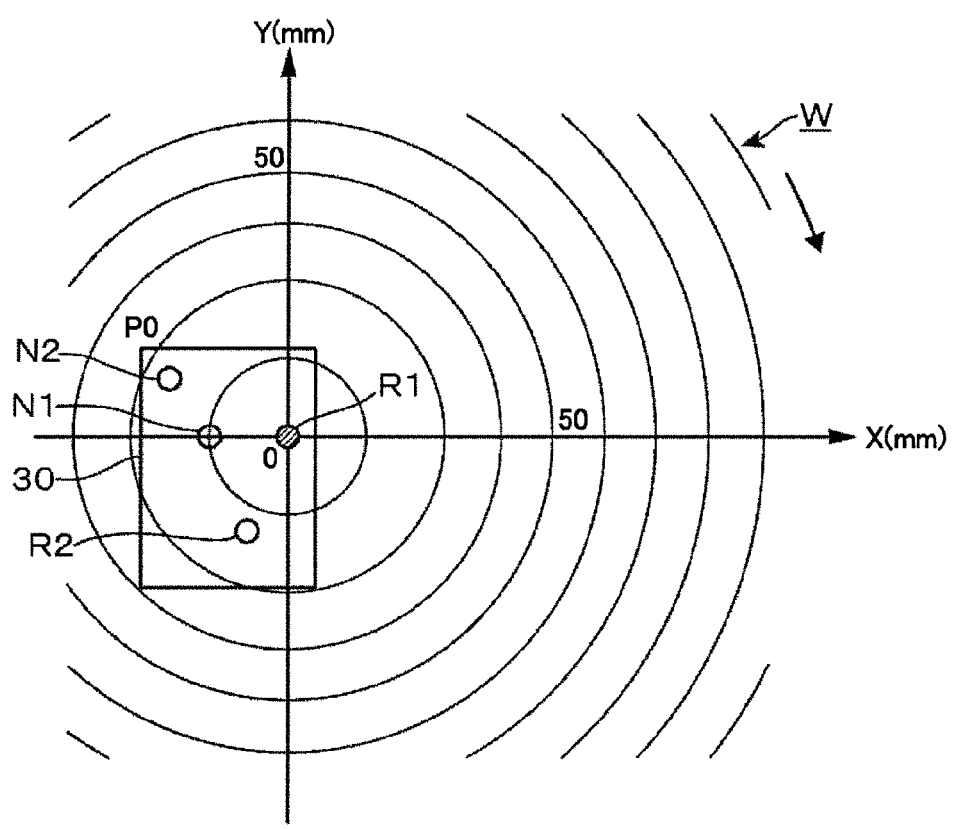
FIG. 6 is an explanatory view illustrating a position of the nozzle arm and states of discharges from nozzles in a cleaning process for a substrate.
Figure 11:
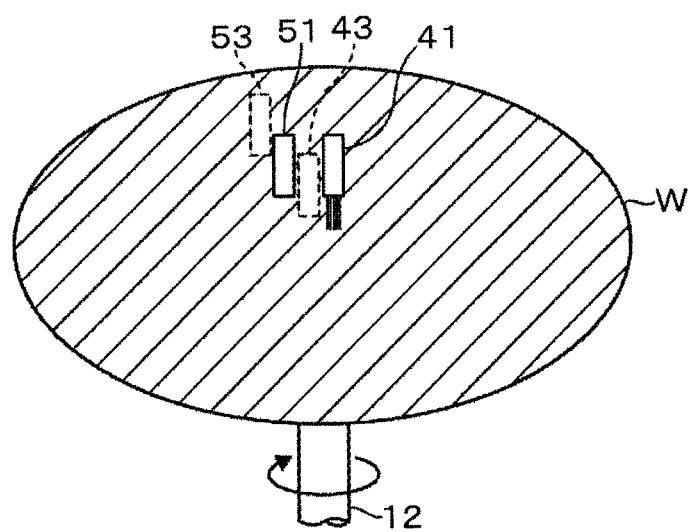
FIG. 11 is an explanatory view illustrating an appearance of cleaning of the wafer in the cleaning process for the substrate.

First, as illustrated in FIG. 6, the nozzle arm 30 is moved to a position indicated with P0 to locate the discharge position R1 of the first cleaning liquid nozzle 41 at the central portion of the wafer W. Thereafter, as illustrated in FIG. 11, while the wafer W is being rotated at a rotation speed of, for example, 1000 rpm, the cleaning liquid, for example, pure water is supplied from the first cleaning liquid nozzle 41 at a flow rate of 30 ml/sec, for example, for 10 seconds. Thus, the first cleaning liquid supplied on the wafer W spreads from the central portion of the wafer W toward the peripheral edge portion by the centrifugal force due to the rotation of the wafer W to wash away the developing solution with the cleaning liquid.

(Step 2)

Figure 7:
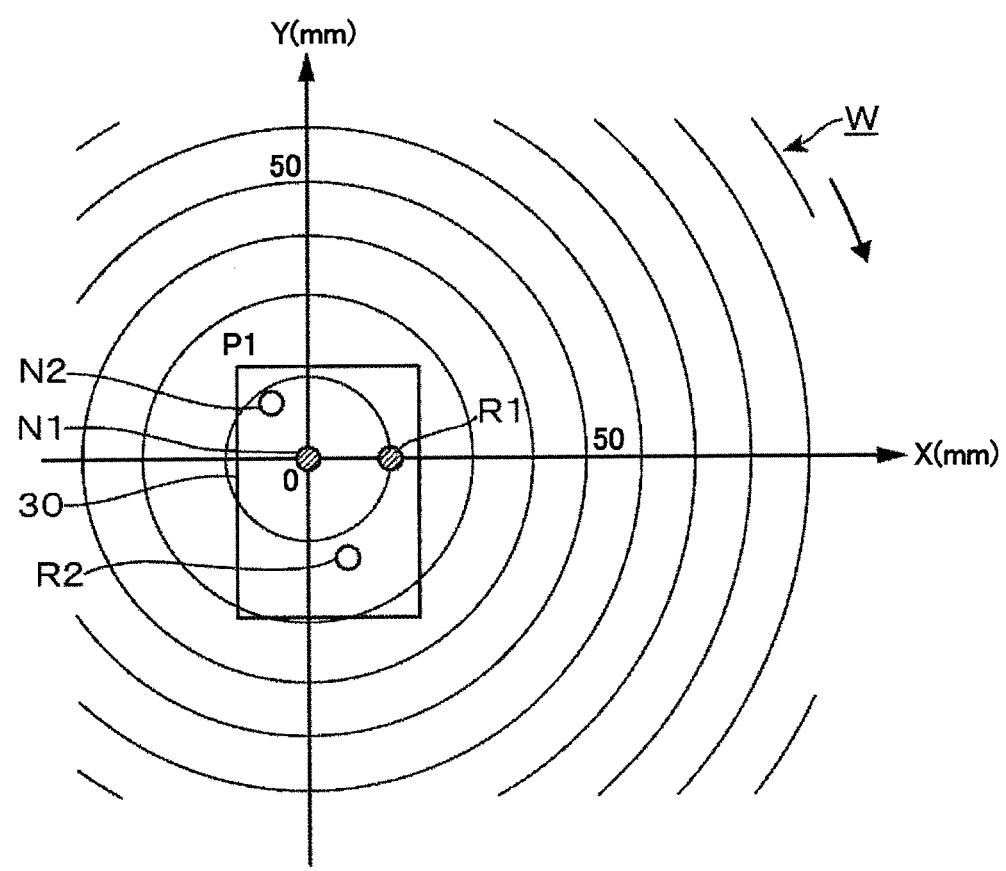
FIG. 7 is an explanatory view illustrating the position of the nozzle arm and the states of discharges from the nozzles in the cleaning process for the substrate.
Figure 12:
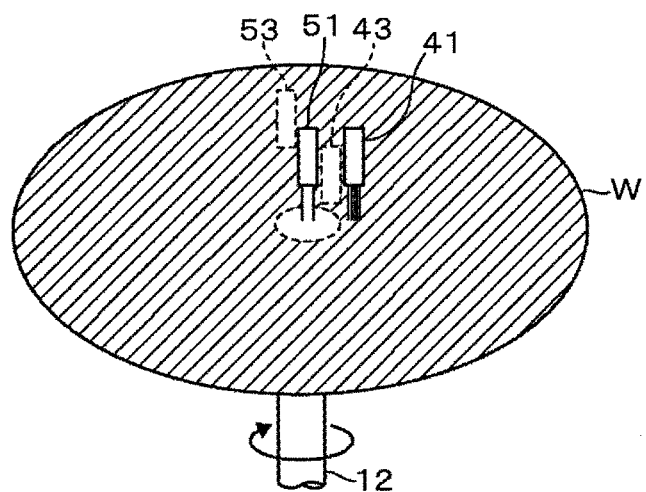
FIG. 12 is an explanatory view illustrating the appearance of cleaning of the wafer in the cleaning process for the substrate.

Then, while the wafer W is kept rotated, the nozzle arm 30 is moved to the right along the X-direction to P1 as illustrated in FIG. 7 with the first cleaning liquid being discharged from the first cleaning liquid nozzle 41 to locate the discharge position N1 of the first nitrogen gas nozzle 51 at the central portion of the wafer W. In this event, the discharge position R1 of the first cleaning liquid nozzle 41 is located away from the central portion of the wafer W to the right in the X-direction by 15 mm. Then, as illustrated in FIG. 12, the nitrogen gas is sprayed from the first nitrogen gas nozzle 51 toward the central portion of the wafer W.

Since the centrifugal force is small at the central portion of the wafer W, a state that a liquid film is formed due to the surface tension of the cleaning liquid is maintained even if the discharge position R1 of the first cleaning liquid nozzle 41 is moved from the central portion of the wafer W to the peripheral edge side. Hence, by spraying the nitrogen gas toward the liquid film, the liquid film breaks to form a dry region where the front surface of the wafer W is exposed. When the dry region is formed, the liquid film is pulled to the peripheral edge side of the wafer W by the centrifugal force due to the rotation of the wafer W and the surface tension of the liquid film. Therefore, the dry region instantaneously spreads to a position corresponding to the discharge position R1 of the first cleaning liquid nozzle 41 (a concentric circle centered at the central portion of the wafer W and passing through the discharge position R1 of the first cleaning liquid nozzle 41).

(Step 3)

Figure 8:
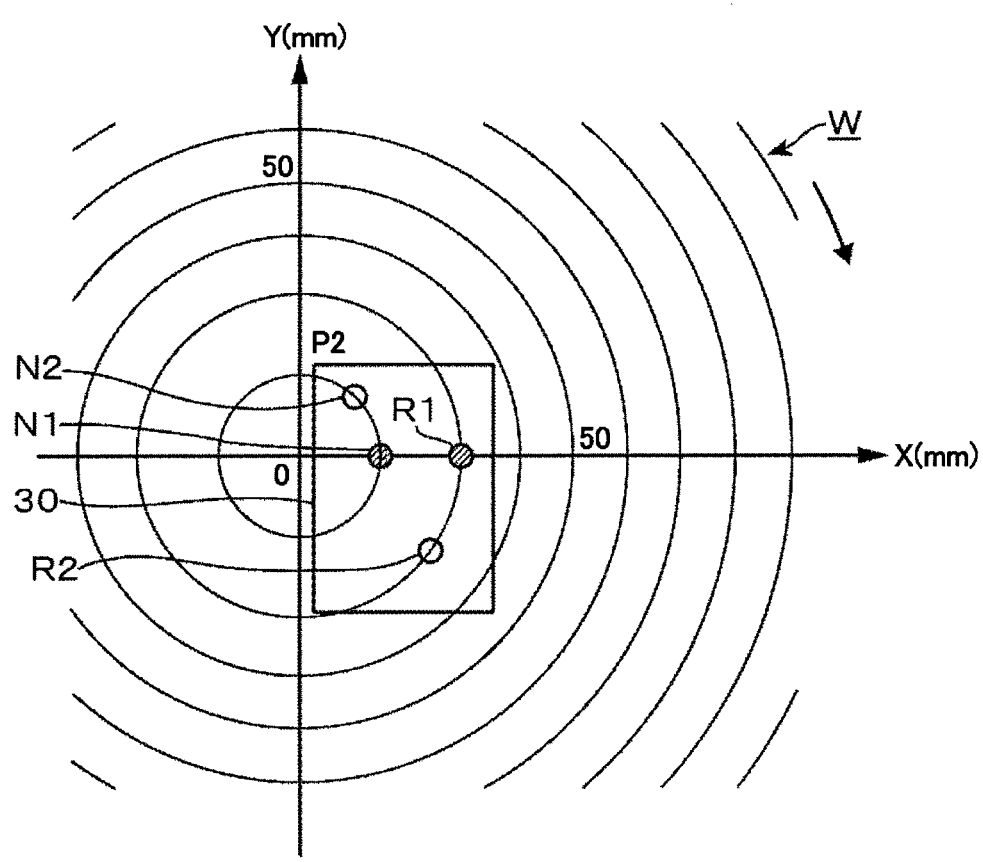
FIG. 8 is an explanatory view illustrating the position of the nozzle arm and the states of discharges from the nozzles in the cleaning process for the substrate.
Figure 13:
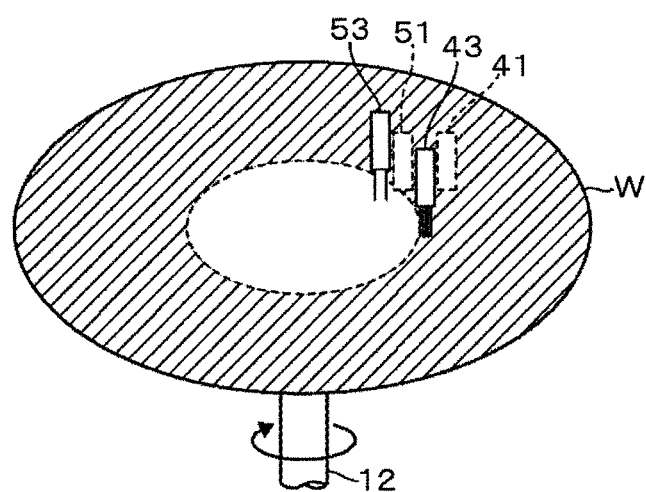
FIG. 13 is an explanatory view illustrating the appearance of cleaning of the wafer in the cleaning process for the substrate.

Subsequently, while the wafer W is kept rotated and the cleaning liquid and the gas are kept discharged from the first cleaning liquid nozzle 41 and the first nitrogen gas nozzle 51 respectively, the nozzle arm 30 is moved to the right in the X-direction of the wafer W by 15 mm as illustrated in FIG. 8 to be located at P2. More specifically, the discharge position R1 of the first cleaning liquid nozzle 41 is moved to a position away from the central portion of the wafer W to the right in the X-direction by 30 mm and the discharge position N1 of the first nitrogen gas nozzle 51 is moved to a position away from the central portion of the wafer W to the right in the X-direction by 15 mm, thereby spreading the dry region to a position corresponding to the discharge position R1 of the first cleaning liquid nozzle 41. Therefore, at Step 3, as the distance between the discharge position R1 of the first cleaning liquid nozzle 41 and the central portion of the wafer W increases with the movement of the nozzle arm 30, the liquid interface is gradually moved in the direction of the peripheral edge of the wafer W as illustrated in FIG. 13.

Figure 14:
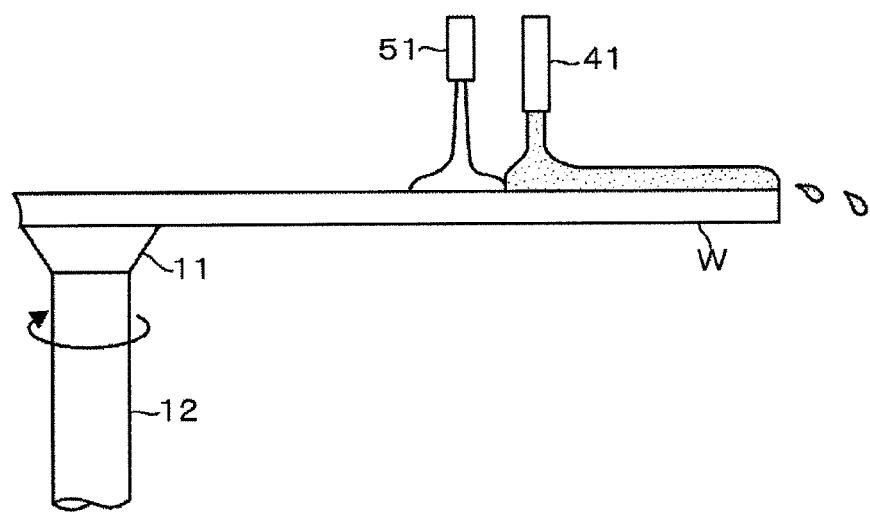
FIG. 14 is an explanatory view illustrating an appearance that a liquid interface is pushed by a nitrogen gas.

In this event, as illustrated in FIG. 14, a strong liquid flow is generated at a position corresponding to the discharge position R1 of the first cleaning liquid nozzle 41, and by discharging the nitrogen gas to a position near the liquid interface, an inner rim of the liquid flow is rolled up, and the roll up of liquid pushes away liquid drops and a product to the peripheral edge side of the wafer W, thereby exerting a strong cleaning power.

(Step 4)

Figure 9:
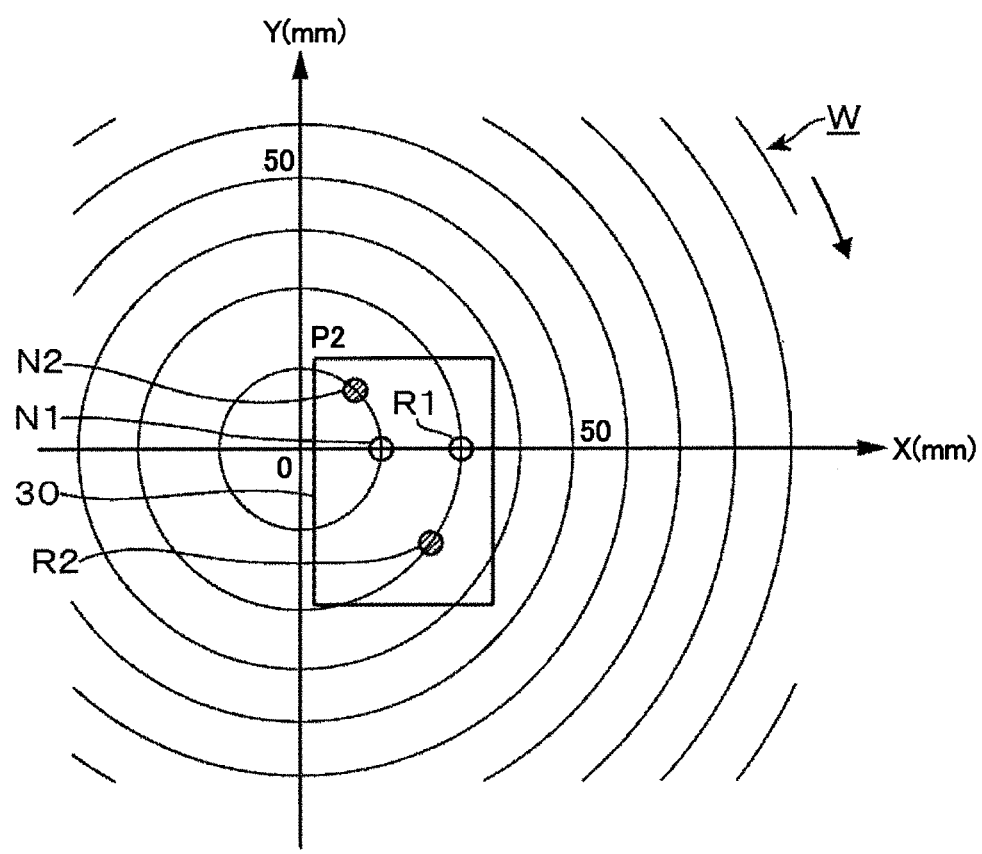
FIG. 9 is an explanatory view illustrating the position of the nozzle arm and the states of discharges from the nozzles in the cleaning process for the substrate.

After the nozzle arm 30 is moved to the position P2, the discharge of the first cleaning liquid is stopped and discharge of the second cleaning liquid is started, and the discharge of the first nitrogen gas is stopped and discharge of the second nitrogen gas is started as illustrated in FIG. 9. The discharge position R2 of the second cleaning liquid nozzle 43 is set such that when the discharge position R1 of the first cleaning liquid nozzle 41 is located away from the central portion of the wafer W by 30 mm, the distance between the discharge position R2 of the second cleaning liquid nozzle 43 and the central portion of the wafer W is 30 mm, namely, the discharge position R1 of the first cleaning liquid nozzle 41 and the discharge position R2 of the second cleaning liquid nozzle 43 are located on the same circle centered at the central portion of the wafer W. Accordingly, also when the nozzle to discharge the cleaning liquid is switched from the first cleaning liquid nozzle 41 to the second cleaning liquid nozzle 43, the position of the liquid interface to be formed on the front surface of the wafer W does not change. Further, when the discharge position R1 of the first cleaning liquid nozzle 41 is located away from the central portion of the wafer W by 30 mm as has been described, the discharge position N1 of the first nitrogen gas nozzle 51 is located away from the central portion of the wafer W to the right by 15 mm. Further, the second nitrogen gas nozzle 53 is provided such that the discharge position N2 of the second nitrogen gas nozzle 53 at that time is located away from the central portion of the wafer W by 15 mm. Accordingly, also when the nozzle to discharge the nitrogen gas is switched from the first nitrogen gas nozzle 51 to the second nitrogen gas nozzle 53, the distance from the discharge position of the nitrogen gas to the liquid interface does not change.

Figure 4:
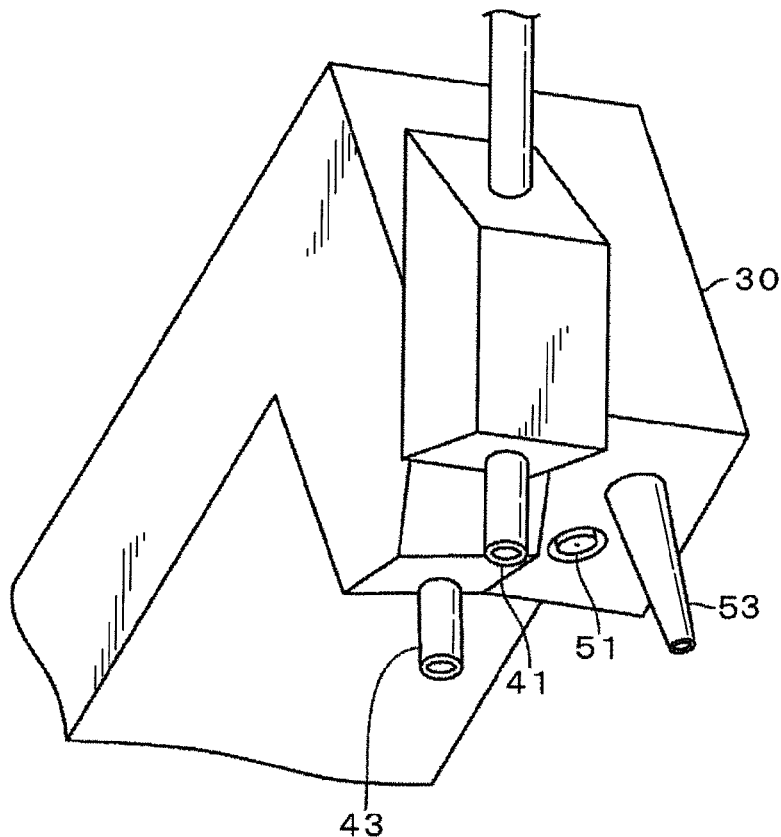
FIG. 4 is a perspective view illustrating a tip portion of the nozzle arm.

Further, the second nitrogen gas nozzle 53 discharges the nitrogen gas at a higher flow rate than the discharge flow rate from the first nitrogen gas nozzle 51, and has a discharge port directed to the peripheral edge side of the wafer W as illustrated in FIG. 4. Accordingly, by switching to the second nitrogen gas nozzle 53, a force pushing the liquid interface by spray of the nitrogen gas becomes stronger. In this event, if the discharge position of the nitrogen gas and the discharge position of the cleaning liquid are close to each other, liquid splash of the cleaning liquid may occur due to the impact of the discharge of the gas. The distance between the discharge position R2 of the second cleaning liquid nozzle 43 and the discharge position N2 of the second nitrogen gas nozzle 53 is set to be longer than the distance between the discharge position R1 of the first cleaning liquid nozzle 41 and the discharge position N1 of the first nitrogen gas nozzle 51. Accordingly, also when the nozzle to discharge the nitrogen gas is switched to the second nitrogen gas nozzle 53 to increase the flow rate of the nitrogen gas, the liquid splash can be suppressed.

(Step 5)

Figure 10:
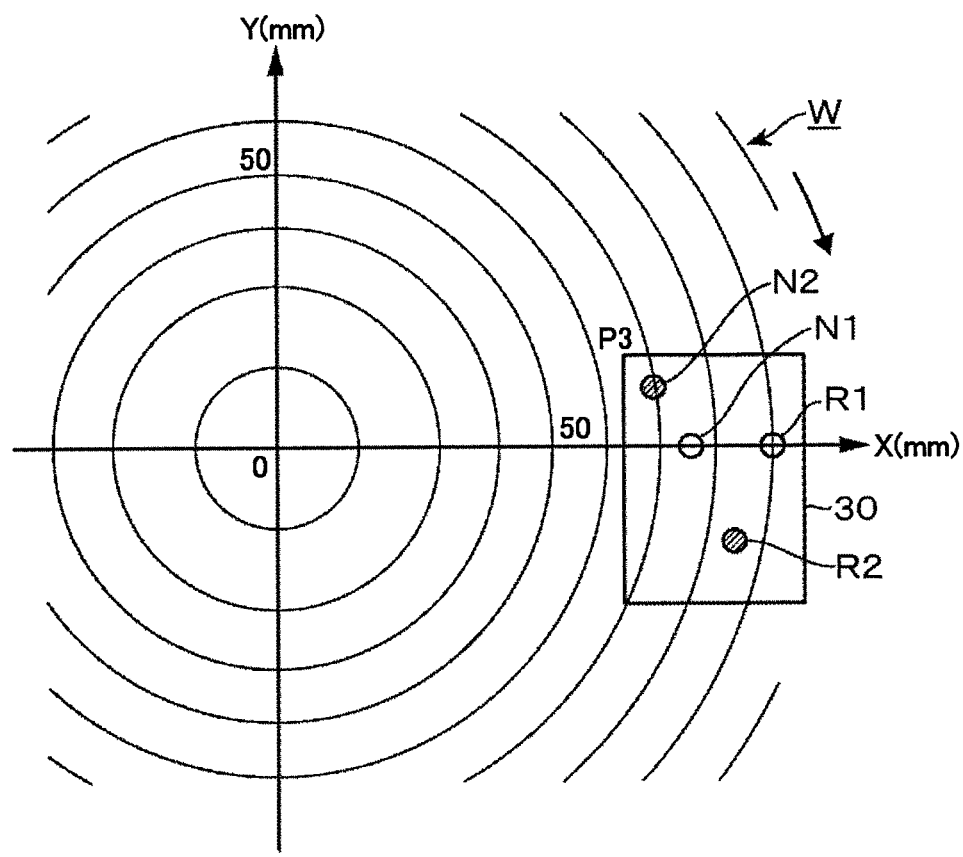
FIG. 10 is an explanatory view illustrating the position of the nozzle arm and the states of discharges from the nozzles in the cleaning process for the substrate.
Figure 15:
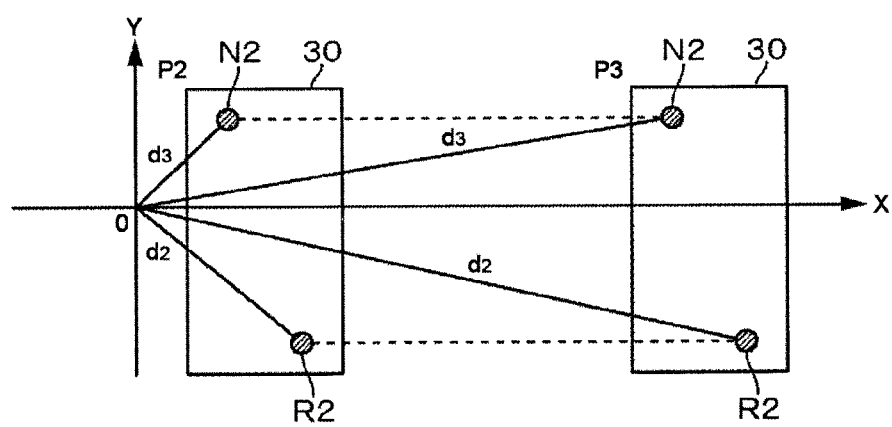
FIG. 15 is an explanatory view illustrating positions of a cleaning liquid nozzle and a nitrogen gas nozzle when the nozzle arm is moved.

Subsequently, the nozzle arm 30 is moved toward the peripheral edge side of the wafer W in the X-direction at a speed of 15 mm/sec. FIG. 10 illustrates a state that the nozzle arm 30 is located at P3 closer to the peripheral edge of the wafer W than at P2. The difference between a distance d2 from the discharge position R2 of the second cleaning liquid nozzle 43 to the central portion of the wafer W and a distance d3 from the discharge position N2 of the second nitrogen gas nozzle 53 to the central portion of the wafer W (d2−d3) is shorter at the time when the nozzle arm 30 is located at P3 than the time when located at P2 as illustrated in FIG. 15.

Here, changes in d2, d3 with the movement of the nozzle arm 30 will be described. The discharge position of the nozzle is expressed by the already-described X-Y coordinate plane (assuming x≥0). When the nozzle arm 30 is moved from P2 to the right along the X-direction by a distance k, the coordinates of the nozzles at the discharge position R2 of the second cleaning liquid nozzle 43 and the discharge position N2 of the second nitrogen gas nozzle 53 are as follows as illustrated in FIG. 16(a).

When the nozzle arm 30 is located at P2, N2=(Na, Nb)
When the nozzle arm 30 is located at P2, R2=(Ra, Rb)
After the nozzle arm 30 is moved by the distance k, N2=(Na+k, Nb)
After the nozzle arm 30 is moved by the distance k, R2=(Ra+k, Rb).

Accordingly, d2 and d3 when the moving distance is set as x are as follows.

When the nozzle arm 30 is located at P3, d2=$\sqrt{[(Ra+x)^2+Rb^2]}$
When the nozzle arm 30 is located at P3, d3=$\sqrt{[(Na+x)^2+Nb^2]}$.

The distance d2 of the discharge position R2 of the second cleaning liquid nozzle 43 from the central portion of the wafer W when the nozzle arm 30 is moved to the right along the X-direction draws a graph like (1) in FIG. 16(b). Further, considering the distance d3 of the discharge position N2 of the second nitrogen gas nozzle 53 from the central portion of the wafer W when the nozzle arm 30 is moved to the right along the X-direction, the discharge position N2 of the second nitrogen gas nozzle 53 is located closer to the X-axis than is the discharge position R2 of the second cleaning liquid nozzle 43, and is thus located closer to the central portion of the wafer W. Accordingly, d3 is smaller in distance to the central portion of the wafer W than is d2 before movement (x=0), and thus becomes larger in increase rate when the nozzle arm 30 is moved to the right in the X-direction by the same distance as d2. Therefore, a graph indicating the moving distance x of the nozzle arm 30 and the distance d3 of the discharge position of the nozzle from the central portion of the wafer W is drawn as a graph in (2) in FIG. 16(b). Accordingly, when the nozzle arm 30 is moved to the right along the X-direction toward the peripheral edge of the wafer W while the cleaning liquid is being discharged from the second cleaning liquid nozzle 43 and the nitrogen gas is being discharged from the second nitrogen gas nozzle 53, the difference (d2−d3) between the distance d2 of the discharge position of the cleaning liquid from the central portion of the wafer W and the distance d3 of the discharge position of the nitrogen gas from the central portion of the wafer W gradually becomes shorter with the movement of the nozzle arm 30.

Figure 17:
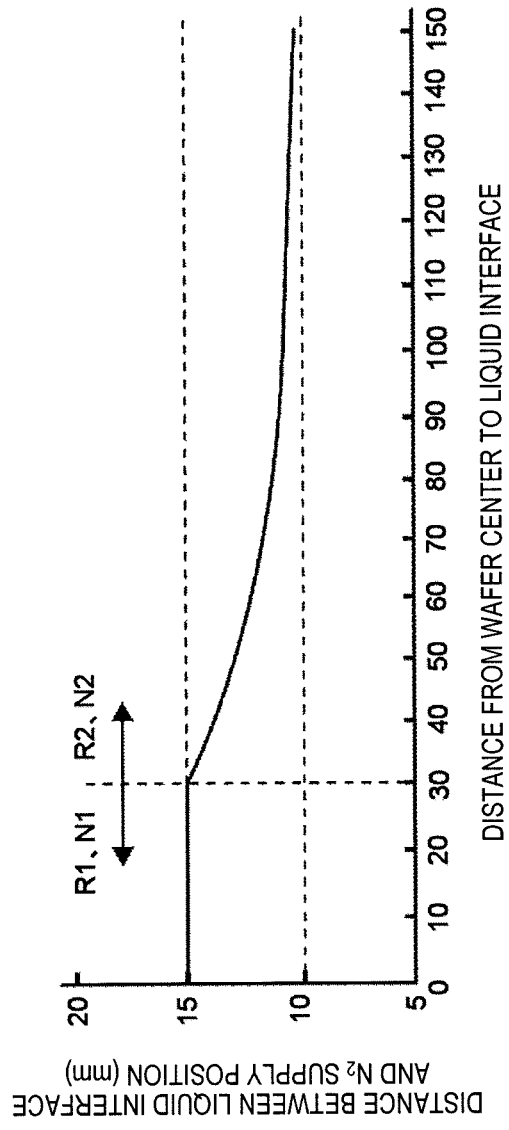
FIG. 17 is a characteristic chart illustrating a relation between the moving distance of the nozzle arm and a distance between the liquid interface and the discharge position of the nitrogen gas.

Since the cleaning liquid is supplied while the water W is being rotated as has been described, the position of the liquid interface of the cleaning liquid is a position along a circumference that is on a slightly inner side of the discharge position of the cleaning liquid. Therefore, the difference between the distance d2 from the discharge position R2 of the second cleaning liquid nozzle 43 to the central portion of the wafer W and the distance d3 from the discharge position N2 of the second nitrogen gas nozzle 53 to the central portion of the wafer W becomes the distance from the discharge position of the nitrogen gas to the liquid interface. FIG. 17 is a characteristic chart illustrating the distance from the central portion of the wafer W to the liquid interface and the change in the separation distance (d2−d3) between the liquid interface and the discharge position of the nitrogen gas. As illustrated in FIG. 17, until the nozzle arm 30 moves to the position of P2 (the liquid interface is located at a position of 30 mm from the central portion of the wafer W), the distance between the liquid interface and the discharge position of the nitrogen gas is constant with no change because the cleaning is performed using the first cleaning liquid nozzle 41 and the first nitrogen gas nozzle 51. Then, after the nozzle arm 30 reaches P2 (the liquid interface is located at a position of 30 mm from the central portion of the wafer W), the discharges of the cleaning liquid and the gas are switched to the second cleaning liquid nozzle 43 and the second nitrogen gas nozzle 53. Therefore, as the nozzle arm 30 is thereafter moved along the X-axis to the peripheral edge side of the wafer W, the liquid interface and the discharge position of the nitrogen gas gradually become closer to each other.

The operation in the case where the supply position of the nitrogen gas is made closer to the liquid interface in a region closer to the peripheral edge of the wafer W will be discussed. In the case where the cleaning of the front surface of the wafer W is performed by washing out the cleaning liquid in the circumferential direction of the wafer by the centrifugal force due to the rotation of the wafer W, the thickness of the cleaning liquid becomes larger at a region closer to the peripheral edge of the wafer W because the cleaning liquid is pushed from the central portion side of the wafer W. The thickness of the cleaning liquid becomes large, the cleaning liquid becomes more unlikely to flow and thus becomes more likely to cause liquid remnant and liquid break. In the above embodiment, the discharge flow rate of the nitrogen gas is made large in a region away from the central portion of the wafer W by 30 mm or more. Therefore, the force pushing the liquid interface in the peripheral edge direction by the nitrogen gas is large. Further, in the region away from the central portion of the wafer W by 30 mm or more, the discharge position of the nitrogen gas becomes closer to the liquid interface as the nozzle arm 30 gets closer to the peripheral edge of the wafer W. Therefore, the force pushing the liquid interface by the nitrogen gas gradually becomes larger as it gets closer to the peripheral edge of the wafer W. Accordingly, in the region closer to the peripheral edge of the wafer W, as the liquid interface gets closer to the peripheral edge of the wafer W, the amount of the cleaning liquid gradually increases but the force pushing the liquid interface in the direction of the peripheral edge of the wafer also increases and thereby can suppress the liquid remnant and liquid break.

In the above embodiment, the first cleaning liquid nozzle 41 and the first nitrogen gas nozzle 51 are used to discharge the cleaning liquid and the nitrogen gas in sequence to the central portion of the wafer W while the wafer W is being rotated, and both of the nozzles 41, 51 are moved to the peripheral edge side of the wafer W. Further, thereafter, the discharge of the cleaning liquid is switched to the second cleaning liquid nozzle 43 set at the position deviated from the movement locus of the first cleaning liquid nozzle 41, and the discharge of the nitrogen gas is switched to the second nitrogen gas nozzle 53. Then, both of the nozzles 43, 53 are moved toward the peripheral edge side of the wafer W while discharging the cleaning liquid and the nitrogen gas, to gradually bring the discharge position of the nitrogen gas closer to the liquid interface. Accordingly, the force pushing the liquid interface by the nitrogen gas becomes stronger in a region closer to the peripheral edge of the wafer W to increase the cleaning effect, thereby suppressing the liquid remnant and liquid break of the cleaning liquid and performing excellent cleaning.

In addition, in the middle of the movement of the nozzle arm 30, the second cleaning liquid nozzle 43 and the second nitrogen gas nozzle 53 are used. The second nitrogen gas nozzle 53 is larger in the discharge flow rate of the nitrogen gas and thus provides a stronger force pushing the liquid interface, thus making it possible to increase the distance between the discharge position of the cleaning liquid and the discharge position of the nitrogen gas and thereby suppress the liquid splash.

Further, in the above embodiment, the first cleaning liquid nozzle 41, the second cleaning liquid nozzle 43, the first nitrogen gas nozzle 51 and the second nitrogen gas nozzle 53 are provided on the common nozzle arm 30. Therefore, the driving systems for the respective nozzles can be made common to reduce the cost of the substrate cleaning apparatus and require small installation space for the nozzle arm 30 and the driving system. Further, the distance between the discharge position of the nitrogen gas and the liquid interface of the cleaning liquid on the front surface of the wafer W is desirably in a range of 9 mm to 17 mm as will be described later. It is desirable to perform simulation beforehand to set the positions of the respective nozzles so that the distance between the discharge position of the nitrogen gas and the liquid interface of the cleaning liquid changes in the range.

Further, it is not always necessary that when the nozzle arm 30 is located at P1, the discharge position R2 of the second cleaning liquid nozzle 43 and the discharge position R1 of the first cleaning liquid nozzle 41 are located on the same concentric circle centered at the central portion of the wafer. Further, when the nozzle arm 30 is located at P1, the discharge position R2 of the second cleaning liquid nozzle 43 may be located closer to the central portion of the wafer W than is the discharge position R1 of the first cleaning liquid nozzle 41 at that time.

Further, the present invention is not limited to provision of the second nitrogen gas nozzle 53, but may be configured to use the first nitrogen gas nozzle 51 to perform cleaning of the wafer W in the process at and after Step 4. Also in this case, as the liquid interface of the cleaning liquid gets closer to the peripheral edge of the wafer W, the discharge position of the nitrogen gas can be made closer to the liquid interface. Accordingly, the force pushing the liquid interface can be made stronger as the liquid interface gets closer to the peripheral edge of the wafer W, thereby providing the same effect.

Further, the first cleaning liquid nozzle 41, the second cleaning liquid nozzle 43, the first nitrogen gas nozzle 51 and the second nitrogen gas nozzle 53 may be provided on nozzle moving units that are separately and independently movable, respectively. Further, it is also adoptable not to provide the second nitrogen gas nozzle 53 but to use only the first nitrogen gas nozzle 51 to perform the cleaning of the wafer W also in the process at and after Step 4. Further, the present invention provides a greater effect when a water contact angle of the substrate is large, and provides a much greater effect in the case of cleaning the surface of a resist film having a water contact angle is 65° or more.

Furthermore, though the discharge from the first nitrogen gas nozzle 51 is stopped and the nitrogen gas is discharged from the second nitrogen gas nozzle 53 at Step 4 in the first embodiment, the case where the gas is discharged from the first nitrogen gas nozzle 51 at a small flow rate during the time when the cleaning liquid and the gas are being discharged from the second cleaning liquid nozzle 43 and the second nitrogen gas nozzle 53 respectively at Step 4 and Step 5 is also within the technical scope of the present invention.

Modified Example of the First Embodiment

Figure 18:
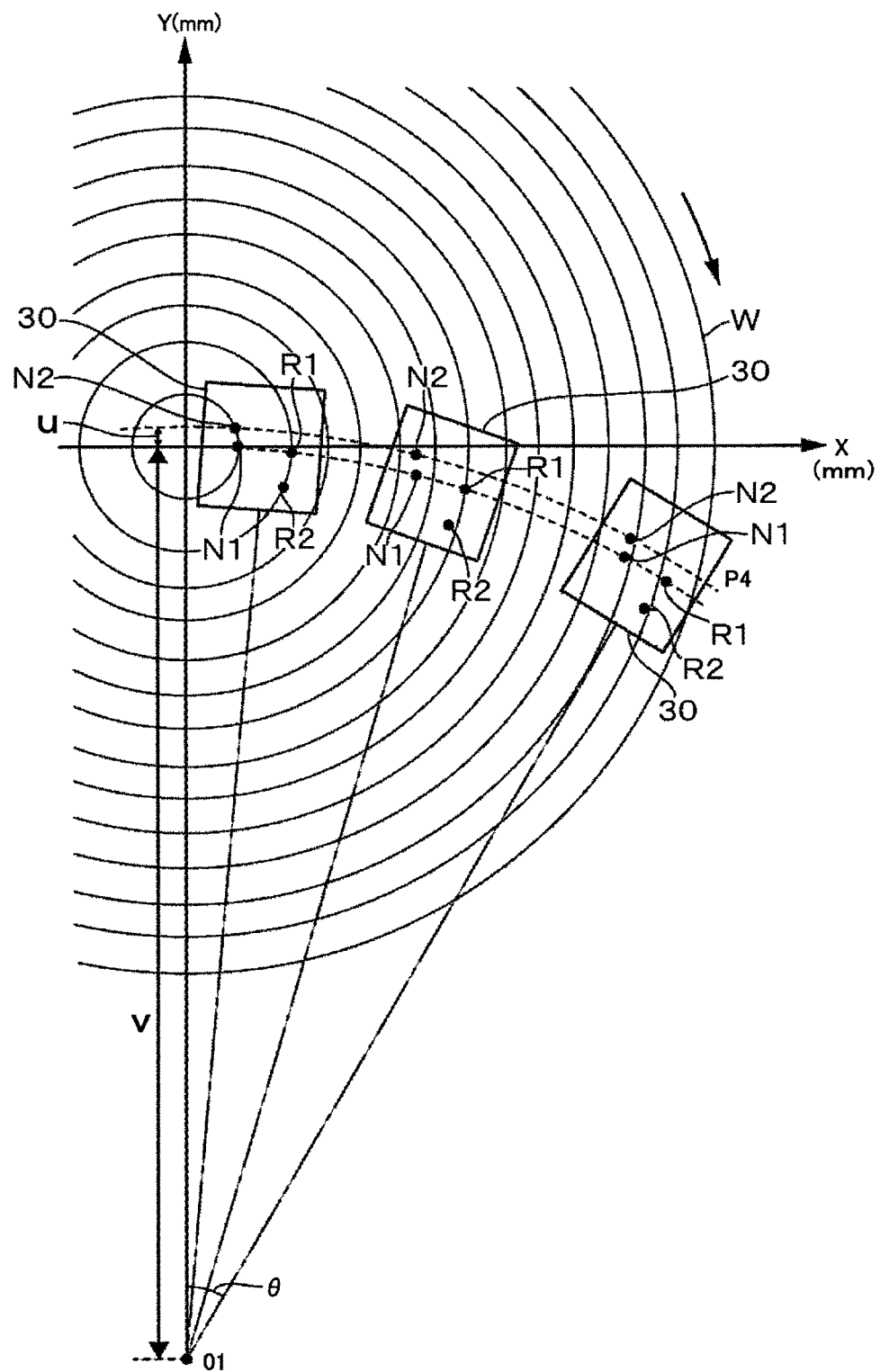
FIG. 18 is a plan view illustrating a substrate cleaning apparatus according to a modified example of the first embodiment.

Further, as a modified example of the first embodiment, the nozzle arm 30 may be provided on a turn arm. More specifically, though the nozzles are moved along straight lines by moving the nozzle arm 30 along the X-direction in the first embodiment, the nozzles may be moved to draw arc loci. FIG. 18 illustrates such an example, and a nozzle arm configured to turn with O1 as a rotation center in FIG. 18 is used as the nozzle arm 30. The drive unit is a not-illustrated rotation unit that turns the and is provided with a not-illustrated raising and lowering unit so that the nozzle arm 30 is configured to freely rise and lower. Accordingly, the nozzle arm 30, the drive unit, and the raising and lowering unit becomes the nozzle moving unit. The discharge position R1 of the first cleaning liquid nozzle 41 and the discharge position N1 of the first nitrogen gas nozzle 51 are provided on an arc locus passing through the central portion of the wafer W. In the case of this embodiment, by turning the nozzle arm 30 at Step 2, the discharge position R1 of the first cleaning liquid nozzle 41 is moved to separate from the central portion of the wafer W by 15 mm, and the discharge position N1 of the first nitrogen gas nozzle 51 is located at the central portion of the wafer W.

Further, at Step 3, the discharge position R1 of the first cleaning liquid nozzle 41 is moved to separate from the central portion of the wafer W by 30 mm. In this event, the discharge position N1 of the first nitrogen gas nozzle 51 gets closer to the liquid interface, but the distance of getting closer is small, so that the distance between the discharge position N1 of the first nitrogen gas nozzle 51 and the liquid interface rarely changes and thus can be handled as being constant. Further, after the nozzles to discharge the cleaning liquid and the nitrogen gas are switched to the second cleaning liquid nozzle 43 and the second nitrogen gas nozzle 53 respectively at Step 4, the nozzle arm 30 is turned to move the nozzles to the peripheral edge side of the wafer W at Step 5.

The relation of the difference between the distance of the discharge position R2 of the second cleaning liquid nozzle 43 from the central portion of the wafer W and the distance of the discharge position N2 of the second nitrogen gas nozzle 53 from the central portion of the wafer W by turning the nozzle arm 30 will be described. V in FIG. 18 is a distance between the rotation axis O1 of the nozzle arm 30 and the central portion of the wafer, and u and θ are parameters indicating a predetermined discharge position which indicate parameters of the discharge position N2 of the second nitrogen gas nozzle 53 when the nozzle arm 30 is located at a position P4 in FIG. 18. u is a distance deviated from the arc locus passing through the central portion of the wafer W centered at the rotation axis O1 (a deviation to the outside of the arc locus is +, and a deviation to the center side is −), and θ is a rotation angle of the nozzle arm 30 (the case where the nozzle is located on a straight line linking the rotation axis O1 and the central portion of the wafer W is 0, and the clockwise rotation direction is +).

When the rotation axis O1 is located outside the region of the wafer and the nozzle is moved from the central portion to the peripheral edge of the wafer W, θ reaches the peripheral edge of the wafer W in a range of 0 degree to 90 degrees. Considering the change in the distance d from the discharge position of the nozzle provided on the nozzle arm 30 to the central portion of the wafer when turning the nozzle arm 30, $$d=\sqrt{[u^2+2uV+2V^2-2V(u+V)\cos\theta]}.$$

Accordingly, the distance between the discharge position of the nozzle and the central portion of the wafer when turning the nozzle arm 30 is decided by the distance V between the rotation axis O1 of the nozzle arm 30 and the central portion of the wafer W, the rotation angle θ, and the distance u deviated from the arc locus.

Figure 19:
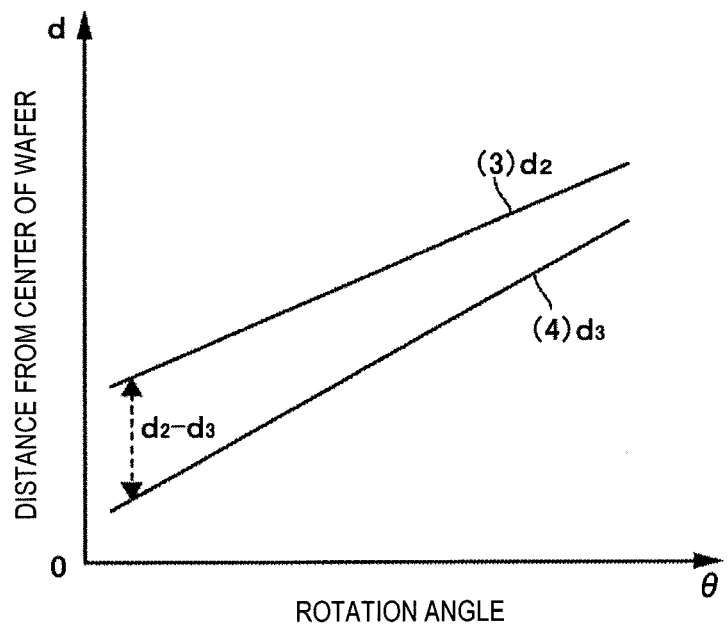
FIG. 19 is a characteristic chart illustrating a relation between a turn angle of the nozzle arm and distances of the nozzles from the central portion of the wafer.

Accordingly, the change in the distance d2 of the discharge position R2 of the second cleaning liquid nozzle 43 from the central portion of the wafer W when turning the arm as illustrated in FIG. 18 is expressed by a solid line illustrated at (3) in FIG. 19. Further, the change in the distance d3 of the discharge position N2 of the second nitrogen gas nozzle 53 from the central portion of the wafer W when turning the arm is expressed by a solid line illustrated at (4) in FIG. 19. Therefore, with turn of the nozzle arm 30 in the direction of the peripheral edge of the wafer W by turning the arm, the difference (d2−d3) between the distance d2 between the discharge position R2 of the second cleaning liquid nozzle 43 and the central portion of the wafer W and the distance d3 between the discharge position N2 of the second nitrogen gas nozzle 53 and the central portion of the wafer W gradually becomes shorter. Therefore, with the movement of the nozzle arm 30 toward the peripheral edge of the wafer, the distance between the liquid interface and the discharge position of the nitrogen gas gradually becomes shorter, so that the force pushing the liquid interface becomes stronger. This makes it possible to suppress the liquid remnant and liquid break.

Second Embodiment

Figure 20:
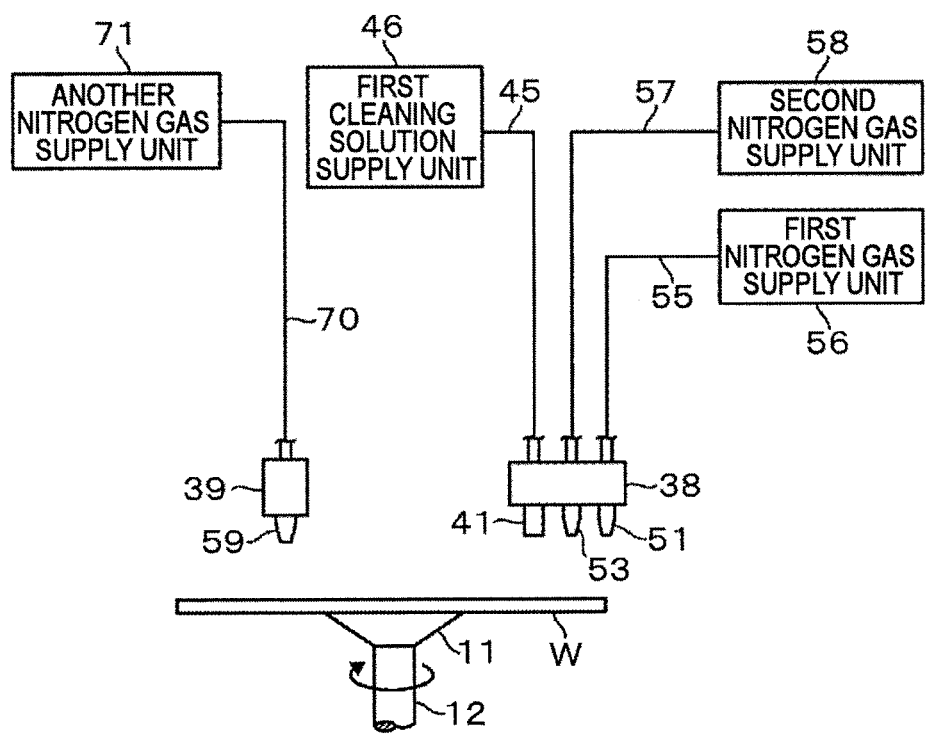
FIG. 20 is a longitudinal sectional view illustrating a substrate cleaning apparatus according to a second embodiment.
Figure 21:
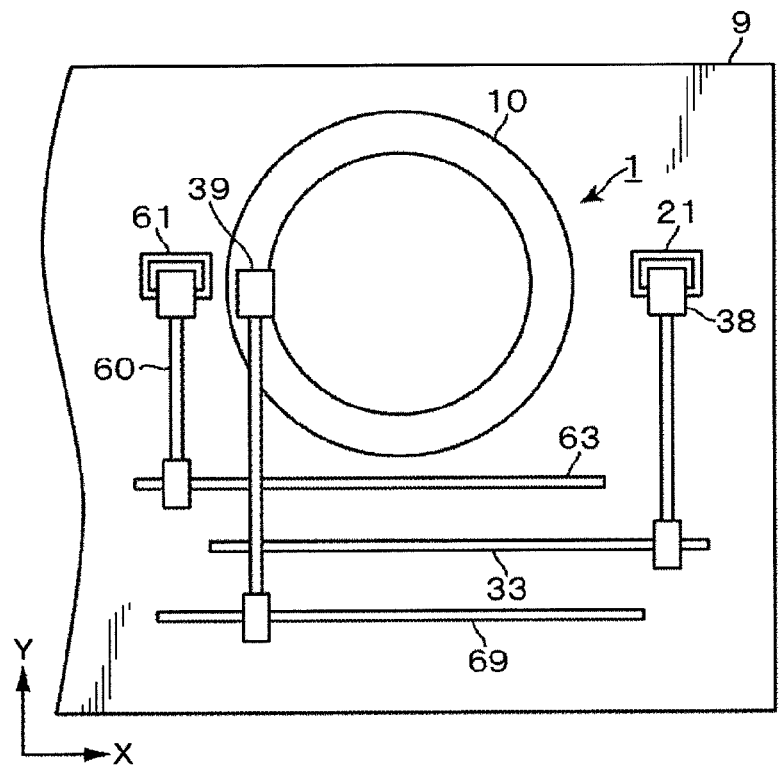
FIG. 21 is a plan view illustrating the substrate cleaning apparatus according to the second embodiment.

Further, as a substrate cleaning apparatus according to a second embodiment, the substrate cleaning apparatus may be configured to have two arms. The second embodiment includes a first nozzle arm 38 that is configured similarly to the nozzle arm 30 illustrated in first embodiment other than that the second cleaning liquid nozzle 43 is not provided, and a second nozzle arm 39 provided with another nitrogen gas nozzle 59 as illustrate, for example, in FIG. 20, FIG. 21. In the drawings, a numeral 60 denotes a nozzle arm for development, a numeral 61 denotes a nozzle bath for a developing solution, and a numeral 63 denotes a guide rail. The second nozzle arm 39 is supported by a drive unit and a raising and lowering unit that are similarly configured to those of the nozzle arm 30, and is configured to move along a guide rail 69 extending parallel to a guide rail 33 for the first nozzle arm 38. The second nozzle arm 39 is configured to move in a region different from a region on the wafer W where the first nozzle arm 38 is moved, for example, a region on the left side along the X-direction from the central portion of the wafer W. Further, the another nitrogen nozzle 59 is connected to another nitrogen gas supply unit 71 via a pipe 70 similarly to the first nitrogen gas nozzle 51 and the second nitrogen gas nozzle 53.

Figure 22:
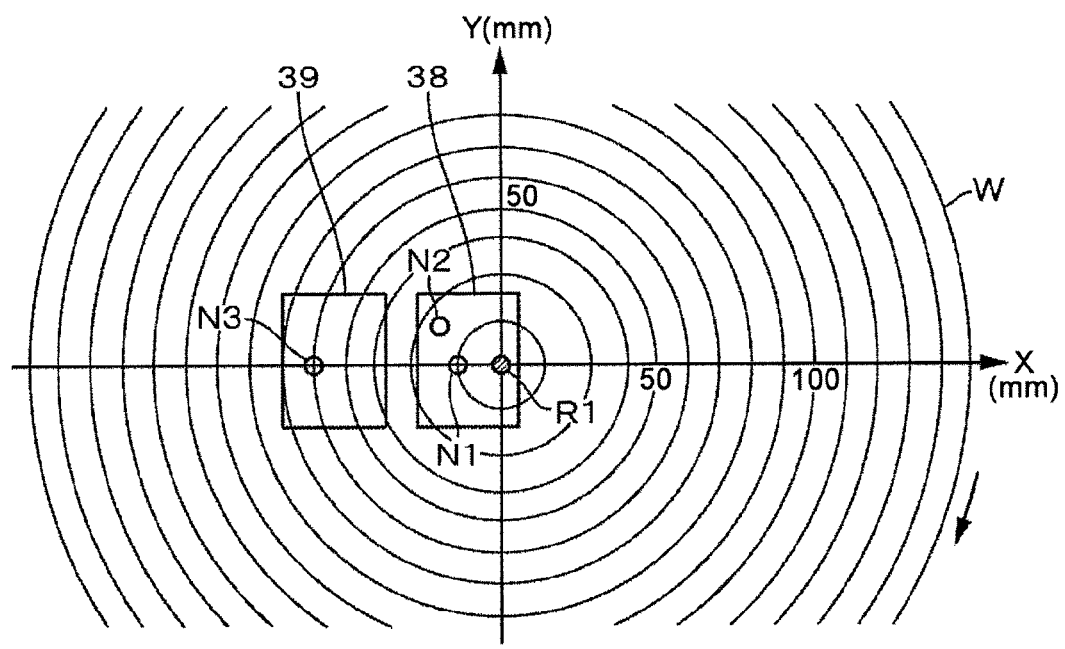
FIG. 22 is an explanatory view illustrating positions of nozzle arms and states of discharges from nozzles in a cleaning process for the substrate.
Figure 23:
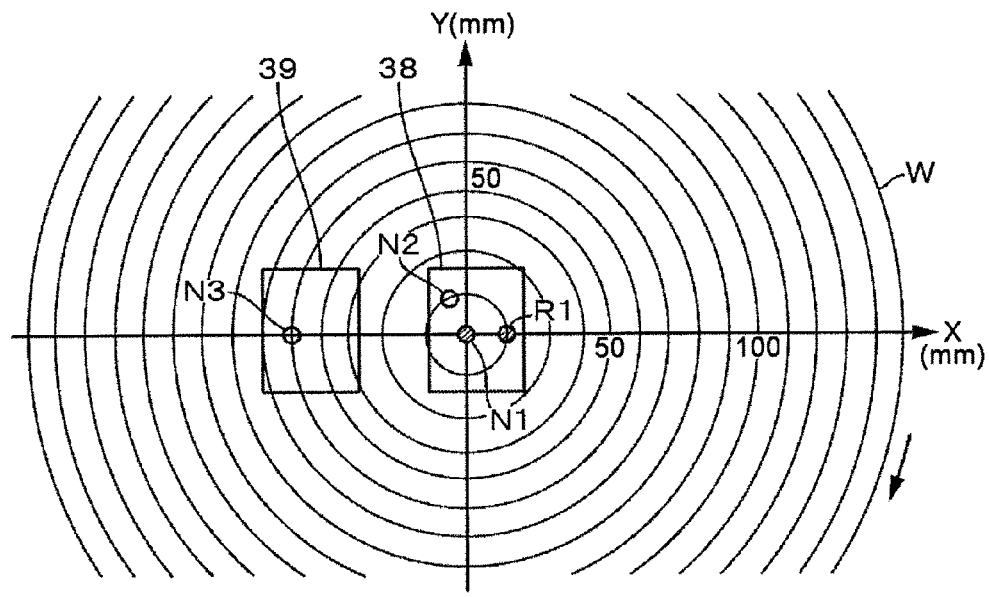
FIG. 23 is an explanatory view illustrating the positions of the nozzle arms and the states of discharges from the nozzles in the cleaning process for the substrate.

The cleaning treatment for the wafer W by the substrate cleaning apparatus according to the second embodiment will be described using FIG. 22 to FIG. 26. Step 1 and Step 3 are processes similar to Step 1 to Step 3 illustrated in the first embodiment as illustrated in FIG. 22, FIG. 23, in which the first nozzle arm 38 is moved so that R1, N1 are located in sequence at the central portion of the wafer W. The second nozzle arm 39 is kept waiting at a point where a discharge position N3 of the nitrogen gas discharged from the another nitrogen gas nozzle 59 is located at a position of 60 mm in the left direction in the drawing along the X-direction from the central portion of the wafer W.

(Step 4)

Figure 24:
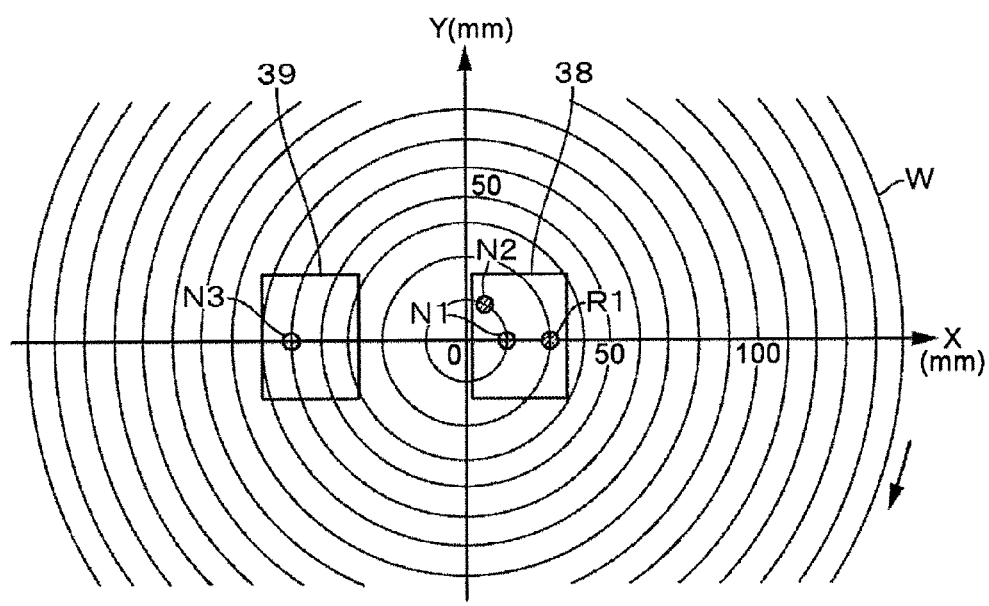
FIG. 24 is an explanatory view illustrating the positions of the nozzle arms and the states of discharges from the nozzles in the cleaning process for the substrate.

As illustrated in FIG. 24, after the discharge position R1 of the first cleaning liquid nozzle 41 is located away from the central portion of the wafer W by 30 mm and the discharge position N1 of the first nitrogen gas nozzle 51 is located away from the central portion of the wafer W by 15 mm, the nozzle to discharge the nitrogen gas is switched from the first nitrogen gas nozzle 51 to the second nitrogen gas nozzle 53.

(Step 5)

Subsequently, the first nozzle arm 38 is moved to a position where the distance between the discharge position N2 of the second nitrogen gas nozzle 53 from the central portion of the wafer W (60 mm in this example) becomes equal to the distance between the discharge position N3 of the another nitrogen gas nozzle 59 from the central portion of the wafer W. During the movement, the discharge of the second cleaning liquid and the discharge of the second nitrogen gas are being performed. Since the second nitrogen gas nozzle 53 is larger in flow rate than the first nitrogen gas nozzle 51, it is possible to push the liquid interface with a stronger force at Step 5 than that at Steps 1 to 3.

(Step 6)

Figure 25:
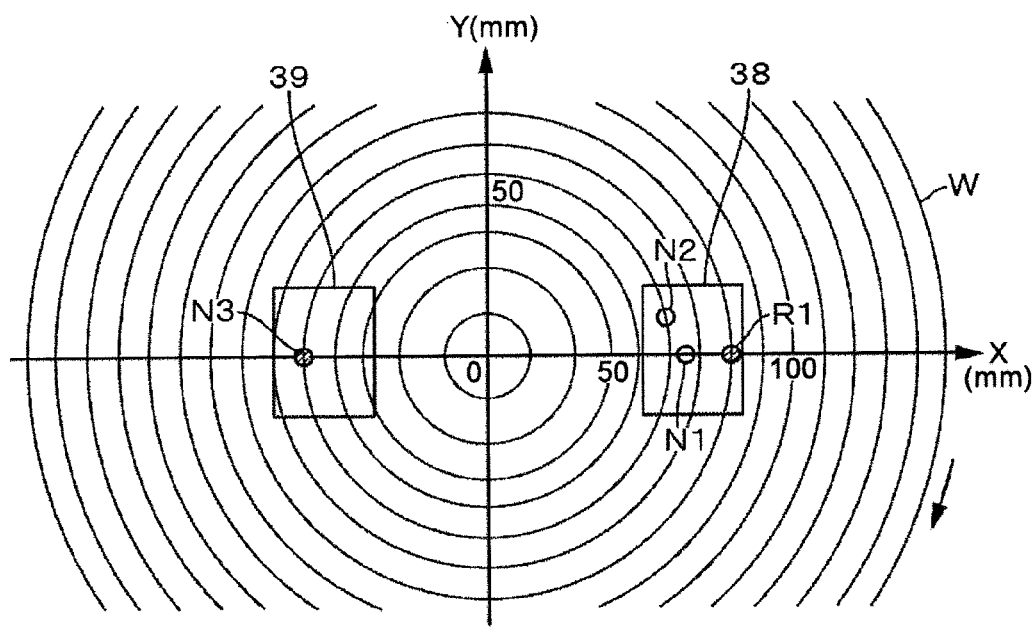
FIG. 25 is an explanatory view illustrating the positions of the nozzle arms and the states of discharges from the nozzles in the cleaning process for the substrate.
Figure 26:
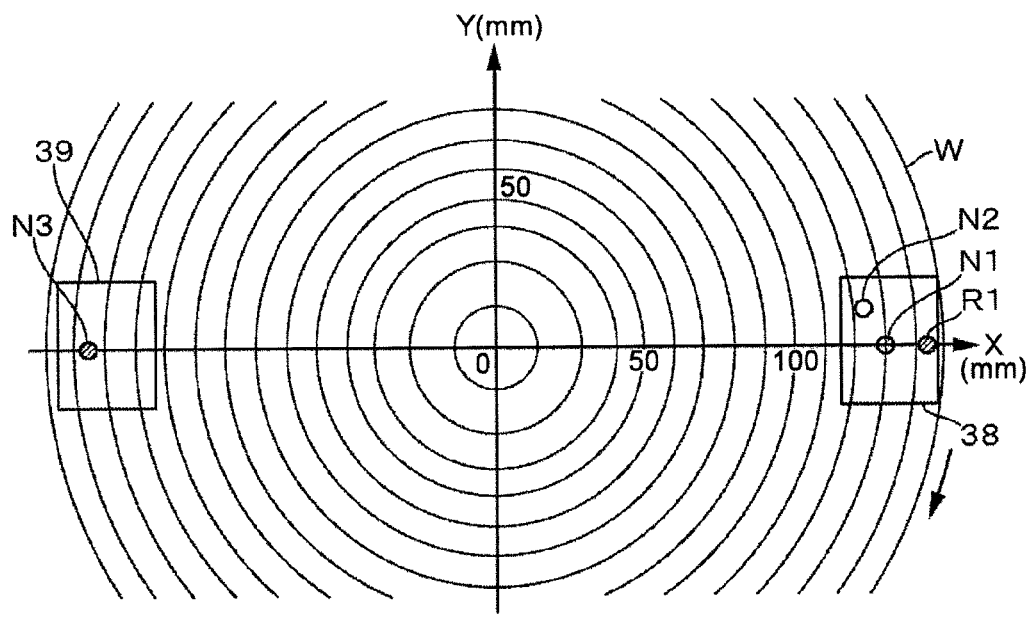
FIG. 26 is an explanatory view illustrating the positions of the nozzle arms and the states of discharges from the nozzles in the cleaning process for the substrate.

Thereafter, the nozzle to discharge the nitrogen gas is switched to the another nitrogen gas nozzle 59, and the first nozzle arm 38 and the second nozzle arm 39 are moved in the direction of the peripheral edge of the wafer W. FIG. 25 illustrates a state after the discharge of the nitrogen gas is switched from the second nitrogen gas nozzle 53 to the another nitrogen gas nozzle 59. In this event, the first nozzle arm 38 is moved to the right along the X-direction as illustrated in FIG. 26, whereas the second nozzle arm 39 is moved to the left along the X-direction. Further, the moving speed of the second nozzle arm 39 is set to a speed higher than that of the first nozzle arm 38. Thus, the difference between a distance L1 from the discharge position of the cleaning liquid to the central portion of the wafer W and a distance L2 from the discharge position of the nitrogen gas to the central portion of the wafer W gradually decreases. Taking an example, L2-L1 gets closer from 17 mm to 9 mm. As a result, the discharge position N3 of the another nitrogen gas nozzle 59 gets closer to the liquid interface as it gets closer to the peripheral edge side of the wafer W, so that the force of the nitrogen gas pushing the liquid interface gradually increases. This suppresses the liquid remnant and liquid break, and thereby can provide the same effect as that in the first embodiment.

Further, the case where the gasses are discharged from the first nitrogen gas nozzles 51, 53 on the first nozzle arm 38, for example, at small flow rates during the time when the second nozzle arm 39 is being moved to the peripheral edge side of the wafer W while the gas is being discharged from the another nitrogen gas nozzle 59 on the second nozzle arm 39 is also within the technical scope of the present invention.

Here, a preferable example when spraying the nitrogen gas to the central portion of the wafer W from the first nitrogen gas nozzle 51 after the cleaning liquid is supplied to the central portion of the wafer W in the first embodiment or the second embodiment will be described. As has been described in the paragraph Description of the Related Art, when the difference in contact angle between the resist and the base is large, the liquid is likely to remain beside the base, and generation of liquid remnant causes residual defects (development defects due to existence of the residual). For example, a silicon oxide film is used for the base, the difference in contact angle is considerably large, and therefore it is preferable to perform the cleaning treatment so as to further suppress the liquid remnant also in this case. Focusing the attention on the vicinity of the central portion of the wafer W, the liquid remnant is likely to occur at the portion because of weak centrifugal force. Hence, it is an effective technique to increase the discharge time of the first nitrogen gas at the central portion of the wafer W, but the treatment time is increased and thereby may cause degraded throughput.

From the viewpoint, an example of the effective technique can be an example of setting the height of a discharge tip portion of the first nitrogen gas nozzle 51 at a position, for example, a height of 5 mm above the front surface of the wafer W. In this case, it is possible to shorten the distance from the tip portion of the first nitrogen gas nozzle 51 to the front surface of the wafer W and thereby suppress the gas dispersion until the nitrogen gas discharged from the first nitrogen gas nozzle 51 reaches the front surface of the wafer W so as to push the liquid interface with stronger shear stress.

Then, after the shear stress of the nitrogen gas is increased, the nitrogen gas is supplied at a low flow rate in the first half to form a dry core (a dry region at the central portion of the liquid), and thereafter supplied at a high flow rate in the second half to spread the dry core. According to this technique, the liquid remnant at the central portion of the wafer W can be further suppressed. The time at the low flow rate and the time at the high flow rate are not limited to be equal. A concrete example will be described in a later-described paragraph Examples.

Figure 27:
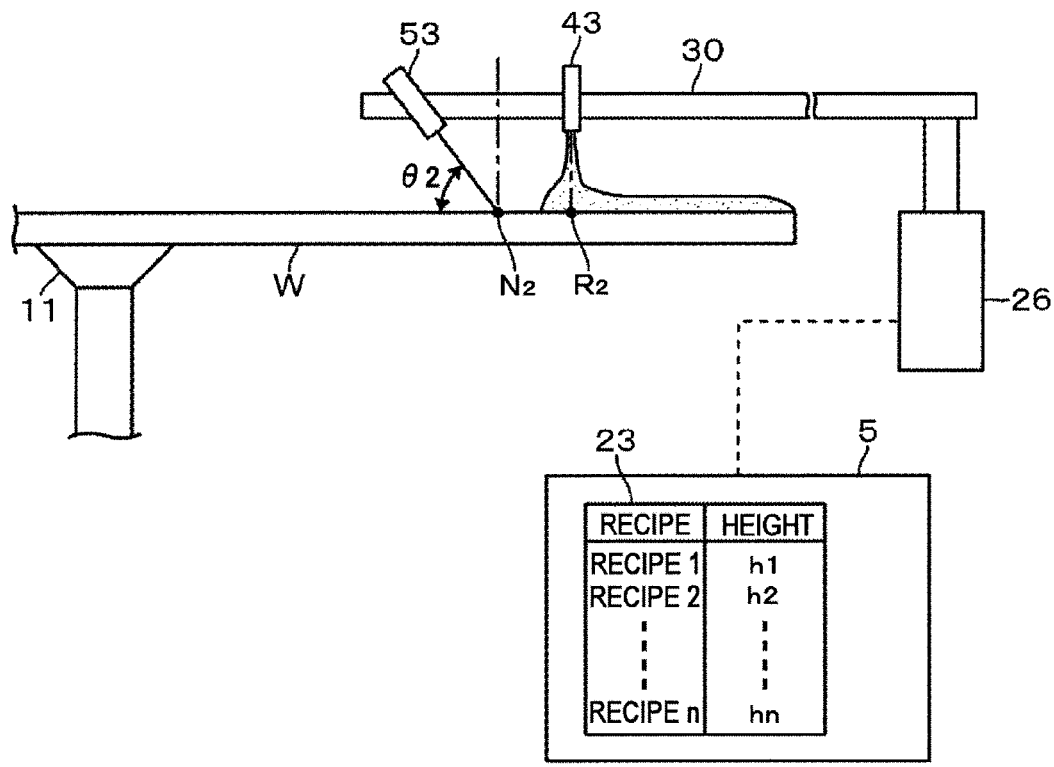
FIG. 27 is a side view illustrating a substrate cleaning apparatus according to another example of the embodiment of the present invention.

Further, effective techniques for suppressing the liquid remnant in a region other than the central portion of the wafer W will be described. Taking the second nitrogen gas nozzle 53 in the first embodiment as one of the techniques, the second nitrogen gas nozzle 53 is provided such that an angle θ 2 of the discharge direction of the nitrogen gas with respect to the horizontal plane is, for example, 45 degrees as illustrated in FIG. 27. The discharge direction of the nitrogen gas means the direction in which the center of the gas flow discharged from the discharge port is directed.

When the nitrogen gas is discharged obliquely from the second nitrogen gas nozzle 53 to the front surface of the wafer W, the shear stress applied on the liquid interface formed on the front surface of the wafer W is larger than the shear stress applied on the liquid interface formed on the front surface of the wafer W when the nitrogen gas is discharged perpendicular to the wafer W. The shear stress applied on the liquid interface when the angle θ 2 of the discharge direction of the nitrogen gas from the second nitrogen gas nozzle 53 with respect to the horizontal plane is 45 degrees has a strength 1.5 times that of the shear stress applied on the liquid interface when the angle θ 2 is 90 degrees. Setting the discharge direction of the nitrogen gas from the second nitrogen gas nozzle 53 to 45 degrees with respect to the horizontal plane as described above to increase the shear stress applied on the liquid interface makes it possible to suppress the liquid remnant and liquid break even if the scan speed of the nozzle arm 30 is increased.

Even in the case where the discharge direction of the nitrogen gas from the second nitrogen gas nozzle 53 is set to 90 degrees with respect to the horizontal plane, a large shear stress can be obtained by increasing the flow rate of the nitrogen gas, but liquid splash and mist may occur. Accordingly, it is effective to obliquely set the discharge direction of the nitrogen gas from the second nitrogen gas nozzle 53, and it is advantageous in particular to set it to 45 degrees with respect to the horizontal plane.

Further, regarding the distance between the discharge position N2 of the second nitrogen gas nozzle 53 and an inner rim of the liquid (liquid interface), an appropriate distance for reducing the residuals differs depending on the kind of the resist on the wafer W, the material of the base film, the recipe of the cleaning treatment so on. Therefore, it is preferable to add the distance as a parameter in the treatment kind of the cleaning treatment so that the distance is decided by selecting a treatment kind. The distance between the discharge position N2 of the second nitrogen gas nozzle 53 and the inner rim of the liquid can be changed by adjusting the height of the second nitrogen gas nozzle 53 when the discharge direction of the nitrogen gas is made oblique from the horizontal plane, for example, when the discharge direction of the nitrogen gas is set to 45 degrees with respect to the horizontal plane.

Figure 28:
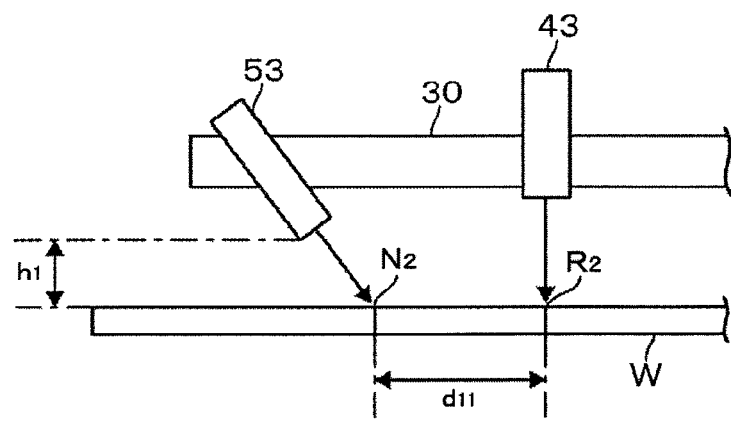
FIG. 28 is an explanatory view for explaining the operation of the substrate cleaning apparatus according to another example of the embodiment of the present invention.

For example, when the height of the tip portion of the second nitrogen gas nozzle 53 from the front surface of the wafer W is h1 as illustrated in FIG. 28, the distance from the discharge position N2 of the second nitrogen gas nozzle 53 to the discharge position R2 of the second cleaning liquid nozzle 43 on the front surface of the wafer W is, for example, d11.

Figure 29:
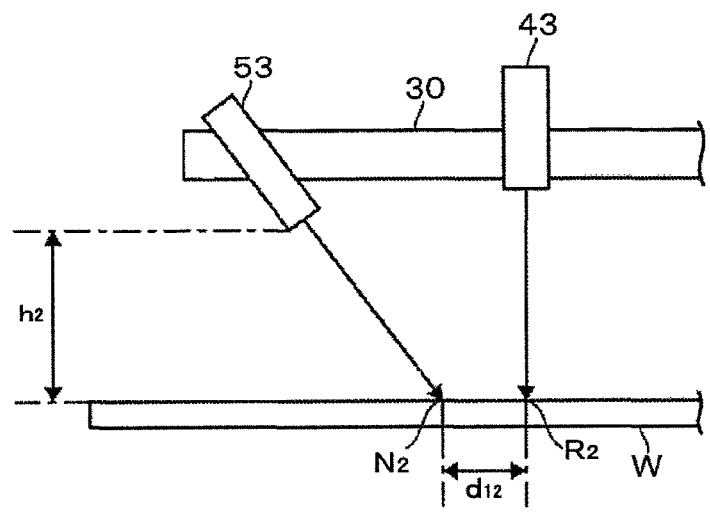
FIG. 29 is an explanatory view for explaining the operation of the substrate cleaning apparatus according to another example of the embodiment of the present invention.

Then, when the nozzle arm 30 is raised so that the height of the tip portion of the second nitrogen gas nozzle 53 from the front surface of the wafer W is h2 as illustrated in FIG. 29, the discharge position N2 of the second nitrogen gas nozzle 53 is moved on the front surface of the wafer W in a direction in which the tip portion of the second nitrogen gas nozzle 53 tilts. On the other hand, the second cleaning liquid nozzle 43 is provided to perform discharge directly below, so that the discharge position R2 of the second cleaning liquid nozzle 43 on the front surface of the wafer W does not change even if the nozzle arm 30 is raised and lowered. Accordingly, the discharge position N2 of the second nitrogen gas nozzle 53 gets closer to the discharge position R2 of the second cleaning liquid nozzle 43, and the distance from the discharge position N2 of the second nitrogen gas nozzle 53 to the discharge position R2 of the second cleaning liquid nozzle 43 becomes d12. Raising and lowering the nozzle arm 30 as described above makes it possible to change the distance from the discharge position N2 of the second nitrogen gas nozzle 53 to the discharge position R2 of the second cleaning liquid nozzle 43. Note that the discharge direction of the cleaning liquid from the second cleaning liquid nozzle 43 does need to be directed directly below but may be oblique as long as it is at an angle (angle with respect to the horizontal plane) different, for example, from the discharge direction of the gas from the second nitrogen gas nozzle 53.

Hence, corresponding to the kind of the cleaning treatment for the wafer W, the appropriate distance from the discharge position N2 of the second nitrogen gas nozzle 53 to the inner rim of the liquid interface is obtained beforehand, and data made by associating the kind (recipe) of the cleaning treatment for the wafer W with the set value of the height of the nozzle arm 30 is stored in the memory 23 in the control unit 5 in advance as illustrated in FIG. 27. Then, the control unit 5 reads the height of the nozzle arm 30 corresponding to the kind of the cleaning treatment for the wafer W from the memory 23 and outputs to the raising and lowering unit 26 a control signal for raising and lowering the nozzle arm 30. Therefore, at the time when a kind of the cleaning treatment is selected according to the lot of the wafer W, the height of the nozzle arm 30 is also decided. The kind of the cleaning treatment may have only the height of the nozzle arm 30 as a parameter and, in this case, when a plurality of heights of the nozzle arm 30 are set, the heights are the kinds of the cleaning treatment.

The above configuration makes it possible to set the distance from the discharge position N2 of the second nitrogen gas nozzle 53 to the inner rim of the liquid interface to an appropriate distance according to the kind of the cleaning treatment for the wafer W, and thereby suppress the liquid remnant and liquid break of the cleaning liquid also in the region other than the central portion of the wafer W.

By setting the angle θ 2 between the discharge direction of the nitrogen gas and the horizontal plane to, for example, 30 degrees to 60 degrees, the shear stress can be enhanced, and the shear stress becomes stronger when the angle θ 2 is set to 45 degrees±5 degrees and thereby provides a greater effect.

Figure 16:
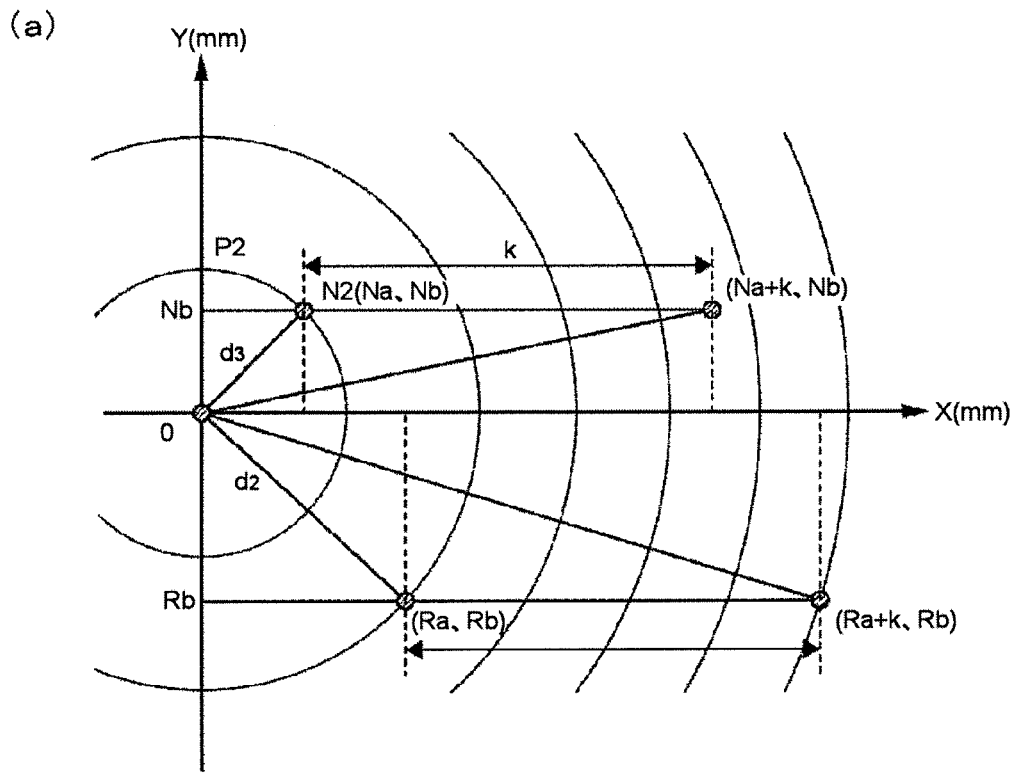
FIG. 16 is an explanatory view illustrating a relation between a moving distance of the nozzle arm and distances from discharge positions to a central portion of the wafer.
Figure 16:
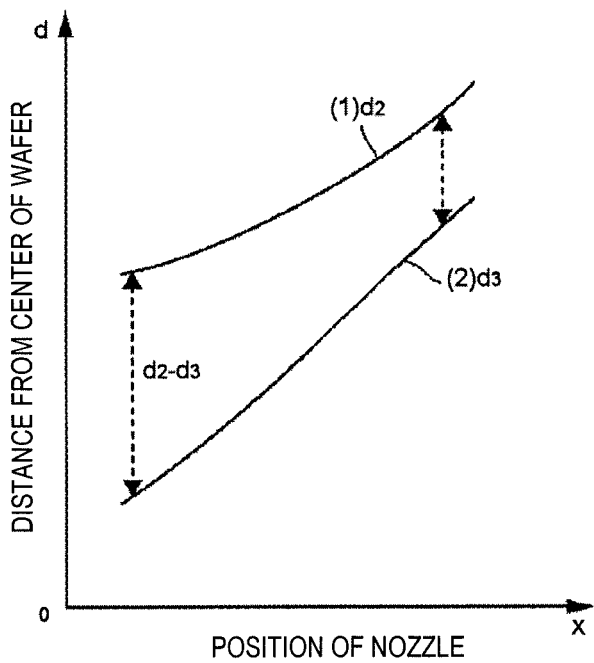

In the first embodiment showing one aspect of the present invention, the first cleaning liquid nozzle 41 (its discharge position is indicated with R1), the second cleaning liquid nozzle 43 (its discharge position is indicated with R2), the first nitrogen gas nozzle 51 (its discharge position is indicated with N1) and the second nitrogen gas nozzle 53 (its discharge position is indicated with N2) are used to ensure the characteristics illustrated in FIG. 16(*b*) and FIG. 17. Namely, in the first embodiment, the one nozzle arm 30 is used, and the arrangement layout of the four nozzles 41, 43, 51, 53 is set so that the relation between the liquid interface and the discharge (supply) position of the N$_2$ gas becomes the relation illustrated in FIG. 17 when the nozzle arm 30 is moved in the X-direction being the direction in which the guide rail for the nozzle arm 30 extends.

However, the relation between the liquid interface and the discharge (supply) position of the N$_2$ gas can be made into the relation illustrated in FIG. 17 even by a structure other than the structure described in the first embodiment, by combination between the layout of the four nozzles 41, 43, 51, 53 and the number and moving directions of the nozzle arms to be used. For example, two nozzle anus may be used to perform the same movements as those in the first embodiment by arranging two of the nozzles 41, 43, 51, 53 on one of the nozzle arms and arranging the remaining two nozzles on the other nozzle arm and moving both of the nozzle arms. In this case, both of the nozzle arms may be moved to separate from each other, or the one nozzle arm may be moved in the X-direction and the other nozzle arm may be moved in the Y-direction to set the arrangement layout to perform the same movements as those in the first embodiment. These examples will be listed below.

First, in the case of using one nozzle arm 30 and moving it in one direction, a layout is made by rotating the layout of the nozzles 41, 43, 51, 53 illustrated in FIG. 6, namely, the layout of the discharge positions R1, R2, N1, N2 by 90 degrees centered at R1, and the nozzle arm 30 may be moved in the Y-direction. In this case, the nozzle arm 30 is combined with a moving mechanism in the Y-direction.

Next, an example in which the nozzles 41, 43, 51, 53 are distributed to two nozzle arms 30A, 30B will be described. To avoid complication of description, the discharge positions R1, R2, N1, N2 of the nozzles 41, 43, 51, 53 will be used for description, in place of description as the layout of the nozzles 41, 43, 51, 53. For example, the expression that "the first cleaning liquid nozzle 41 is provided on the nozzle arm so that its discharge position R1 is located illustrated in the drawing" is simplified as the expression that "the nozzle arm locates R1 as illustrated in the drawing."

Figure 30:
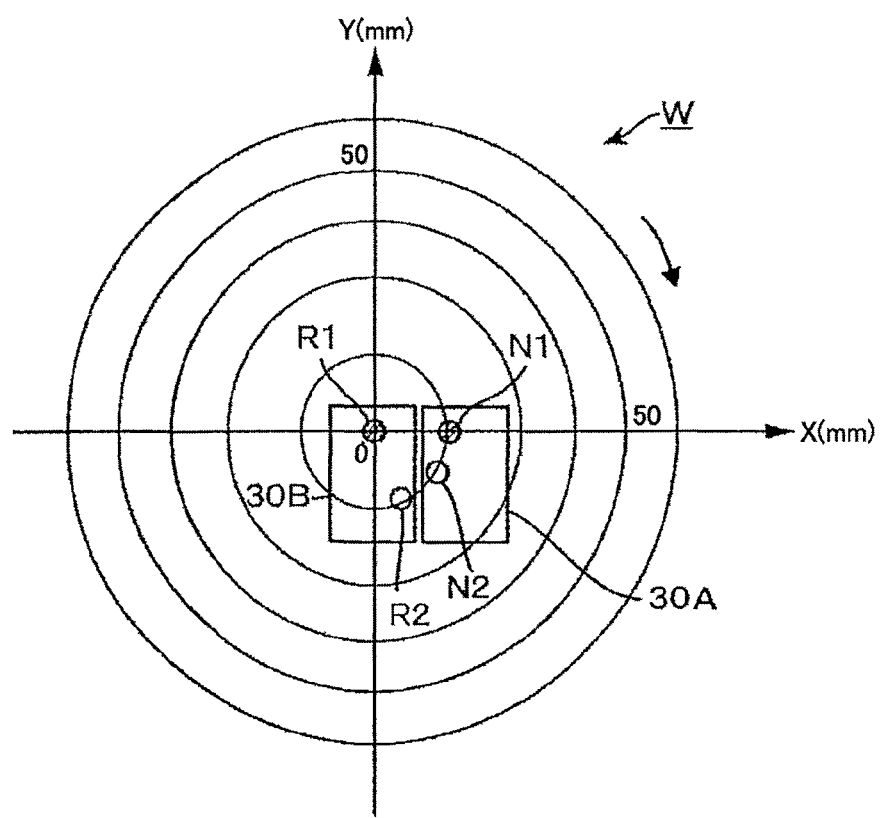
FIG. 30 is an explanatory view illustrating positions of nozzle arms and states of discharges from nozzles in a cleaning process for the substrate.
Figure 31:
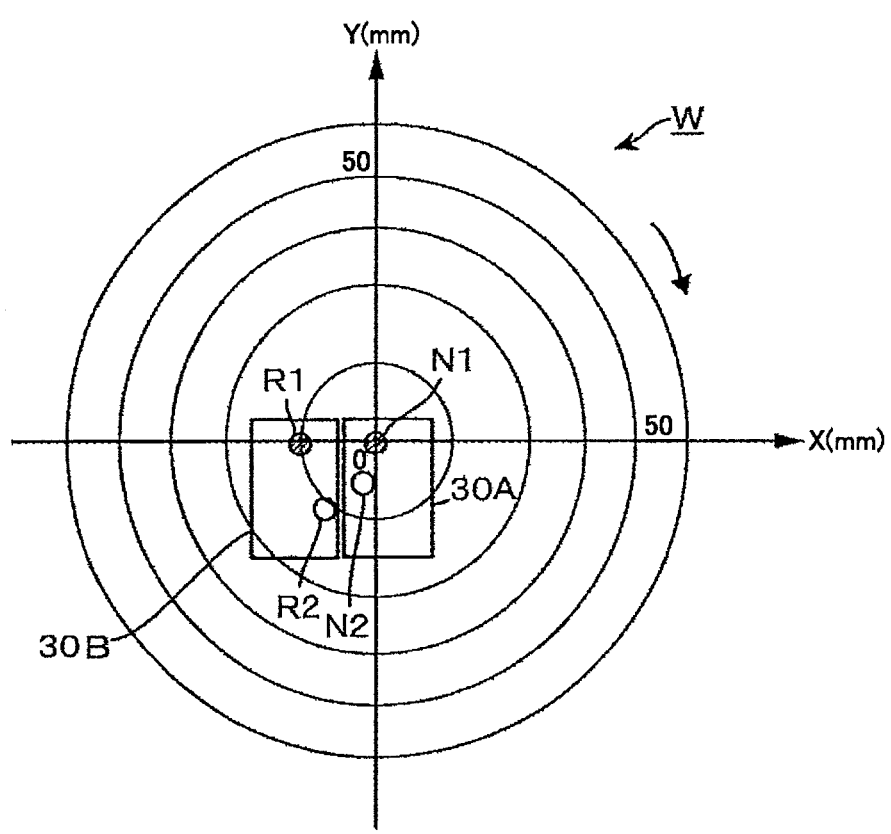
FIG. 31 is an explanatory view illustrating the positions of the nozzle arms and the states of discharges from the nozzles in the cleaning process for the substrate.
Figure 32:
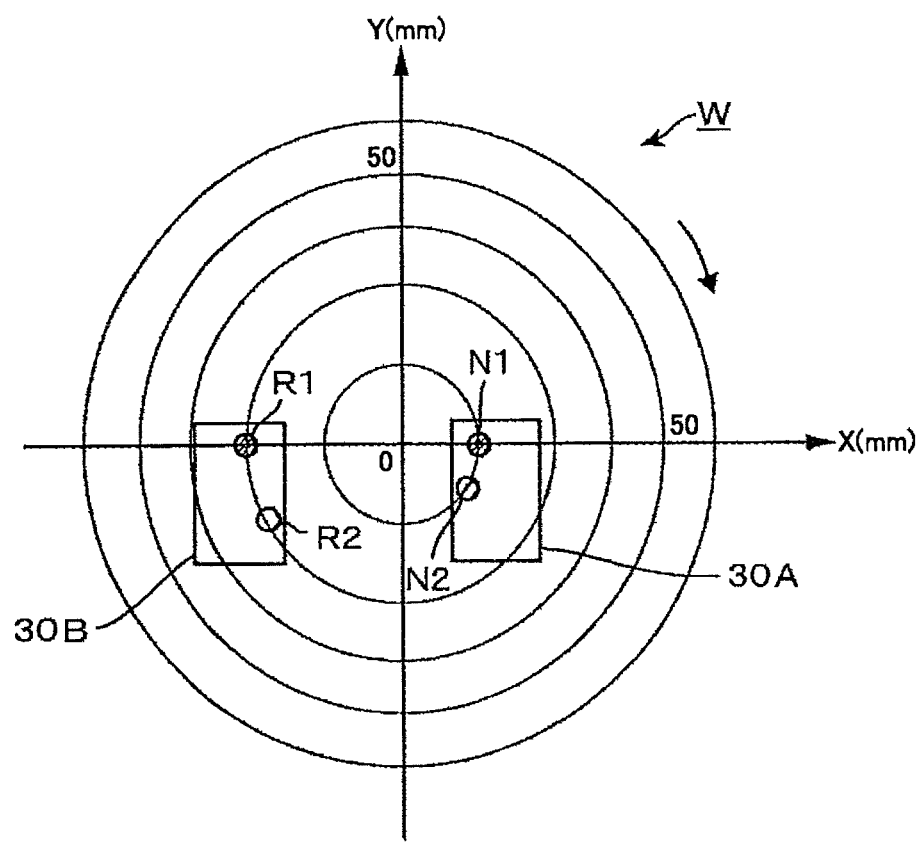
FIG. 32 is an explanatory view illustrating the positions of the nozzle arms and the states of discharges from the nozzles in the cleaning process for the substrate.

FIG. 30 is an example in which the one nozzle arm 30A locates N1, N2 and the other nozzle arm 30B locates R1, R2, illustrating a state that R1 is located at the central portion of the wafer W. FIG. 31 illustrates a state that both of the nozzle arms 30A, 30B are moved so that N1 is located at the central portion of the wafer W, and FIG. 32 illustrates positions where the discharges of the cleaning liquid and the nitrogen gas are switched from R1, N1 to R2, N2. FIG. 30 to FIG. 32 correspond to FIG. 6 to FIG. 8 respectively.

Figure 33:
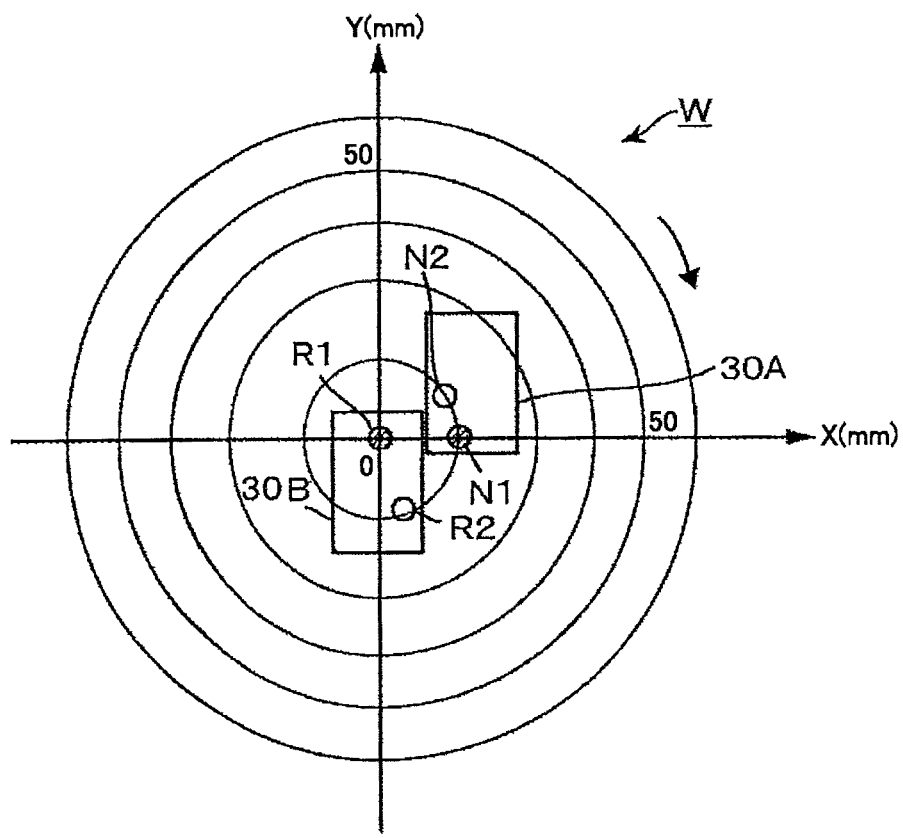
FIG. 33 is an explanatory view illustrating positions of nozzle arms and states of discharges from nozzles in the cleaning process for the substrate.
Figure 34:
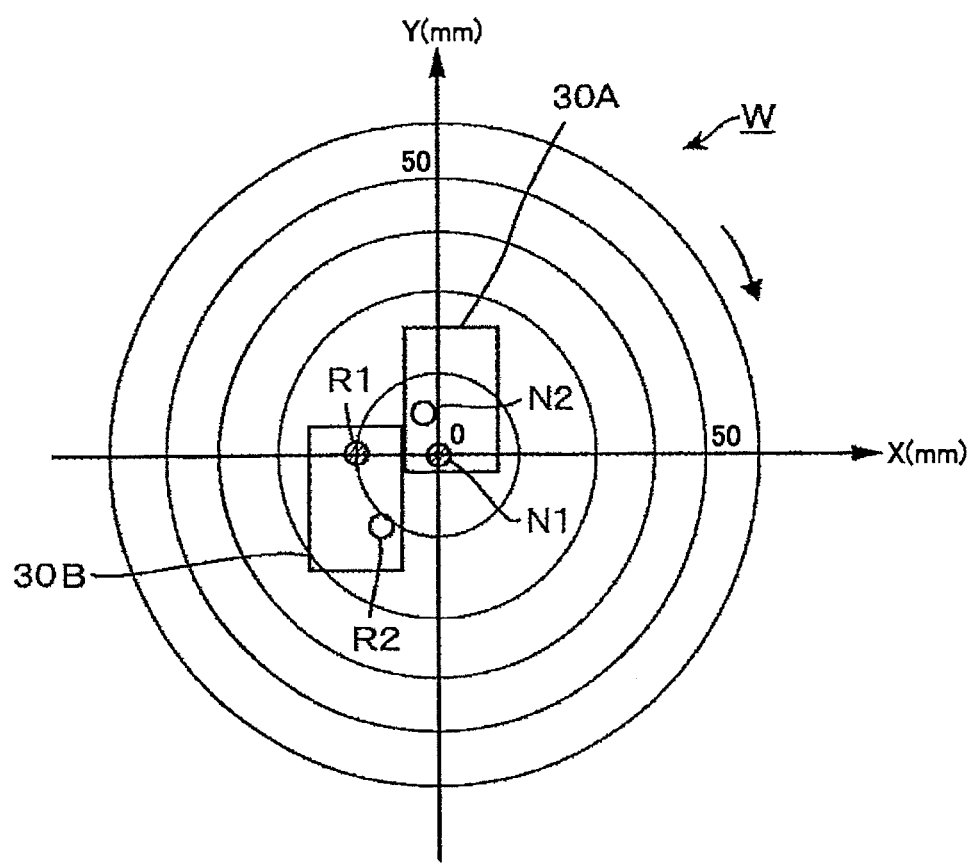
FIG. 34 is an explanatory view illustrating the positions of the nozzle arms and the states of discharges from the nozzles in the cleaning process for the substrate.
Figure 35:
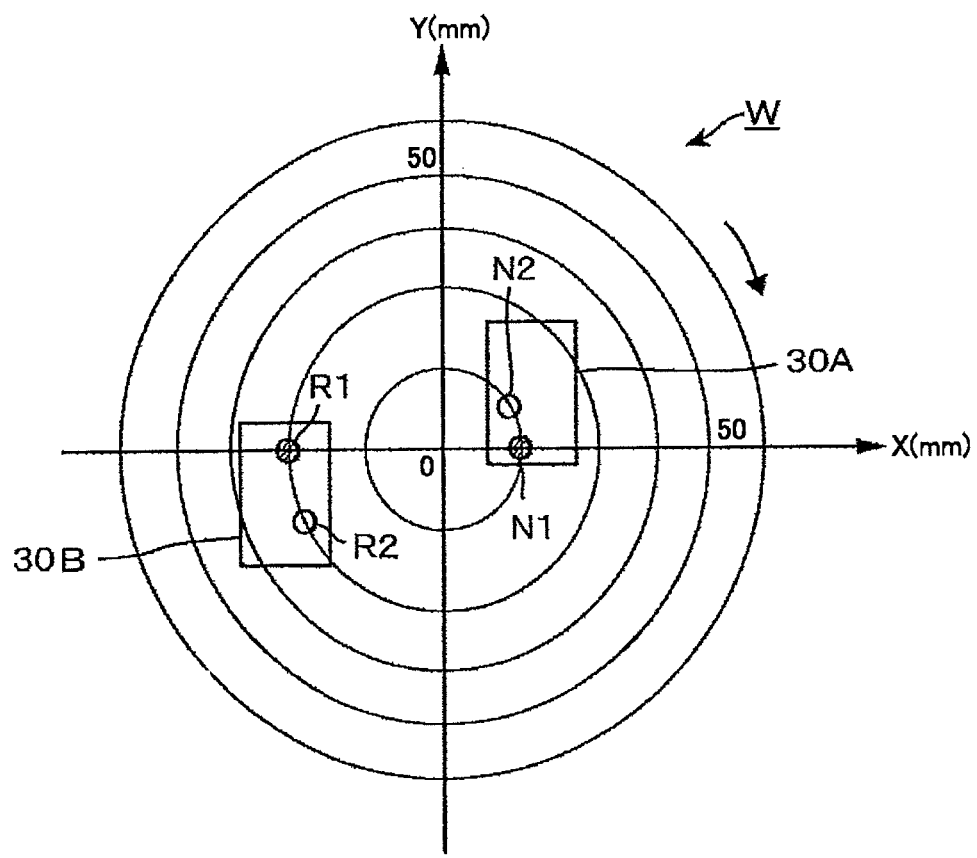
FIG. 35 is an explanatory view illustrating the positions of the nozzle arms and the states of discharges from the nozzles in the cleaning process for the substrate.
Figure 36:
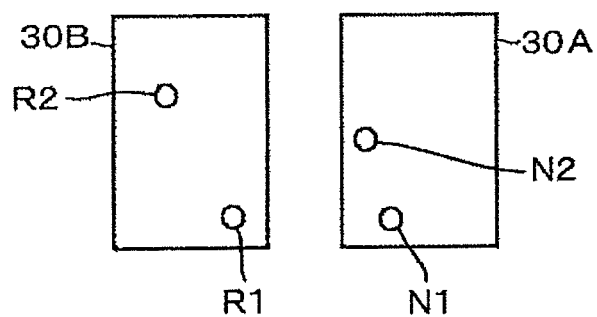
FIG. 36 is an explanatory view illustrating an example of nozzles installed on nozzle arms.
Figure 37:
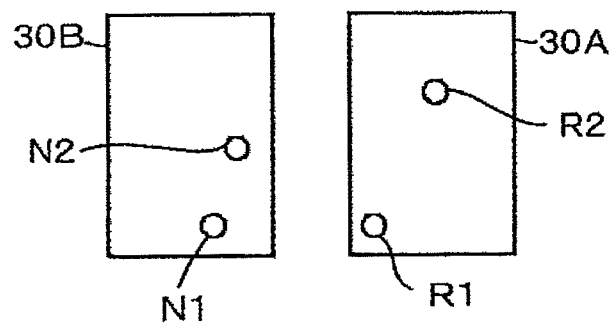
FIG. 37 is an explanatory view illustrating an example of the nozzles installed on the nozzle arms.
Figure 38:
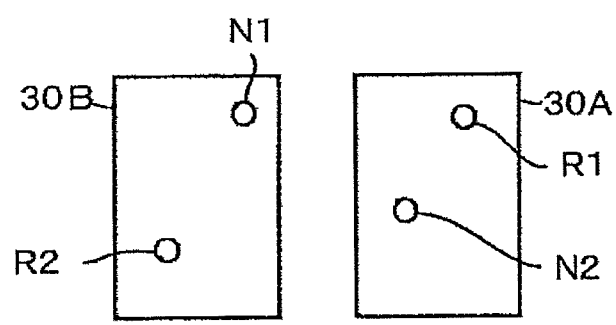
FIG. 38 is an explanatory view illustrating an example of the nozzles installed on the nozzle arms.
Figure 39:
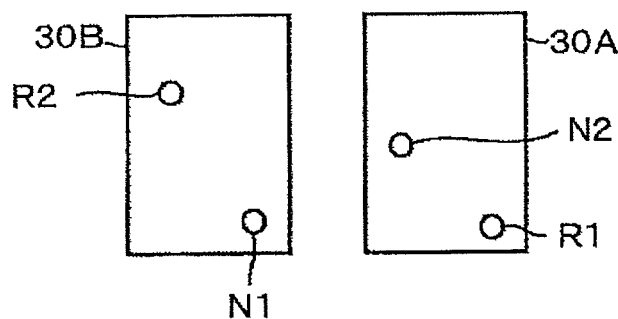
FIG. 39 is an explanatory view illustrating an example of the nozzles installed on the nozzle arms.
Figure 40:
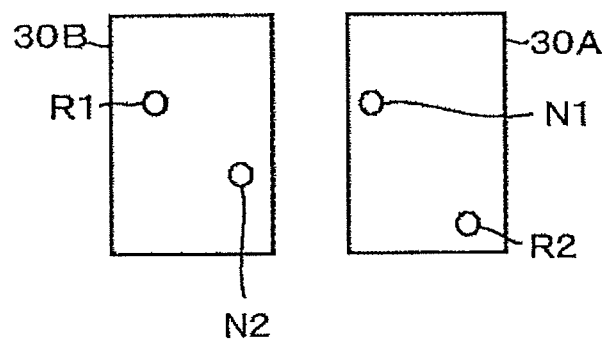
FIG. 40 is an explanatory view illustrating an example of the nozzles installed on the nozzle arms.
Figure 41:
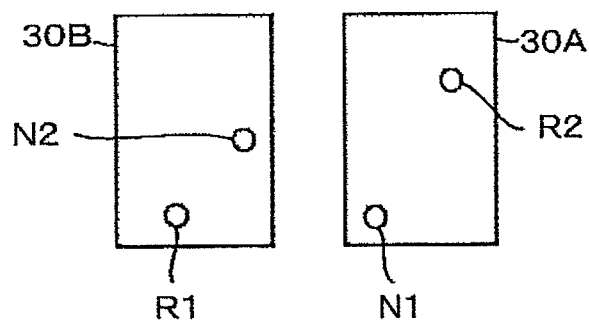
FIG. 41 is an explanatory view illustrating an example of the nozzles installed on the nozzle arms.
Figure 42:
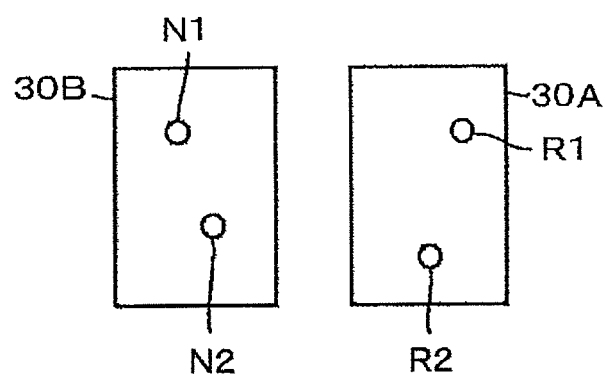
FIG. 42 is an explanatory view illustrating an example of the nozzles installed on the nozzle arms.
Figure 43:
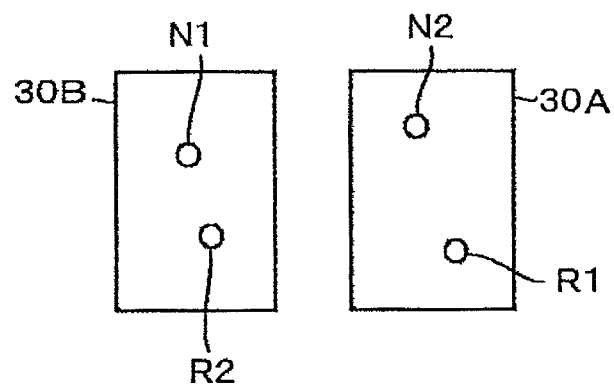
FIG. 43 is an explanatory view illustrating an example of the nozzles installed on the nozzle arms.
Figure 44:
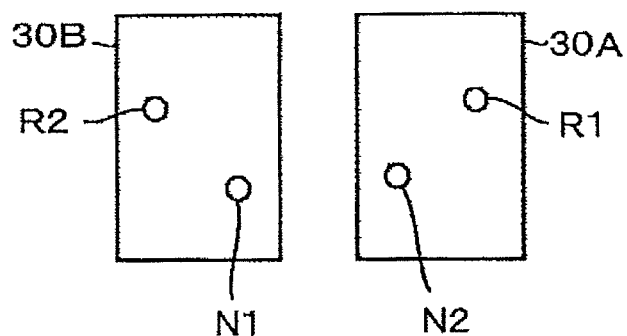
FIG. 44 is an explanatory view illustrating an example of the nozzles installed on the nozzle arms.
Figure 45:
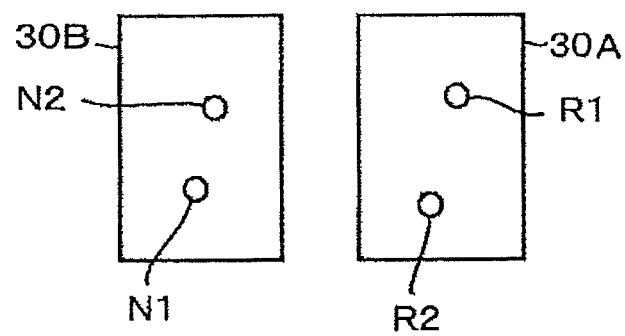
FIG. 45 is an explanatory view illustrating an example of the nozzles installed on the nozzle arms.
Figure 46:
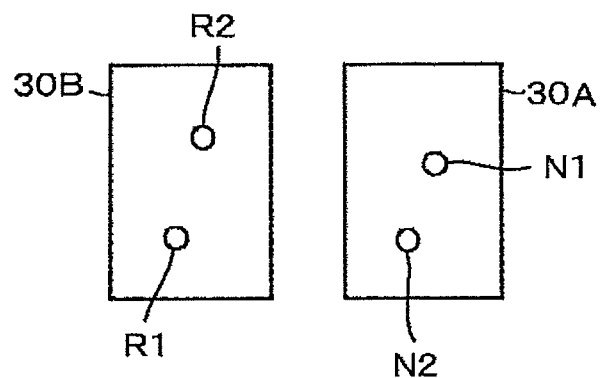
FIG. 46 is an explanatory view illustrating an example of the nozzles installed on the nozzle arms.
Figure 47:
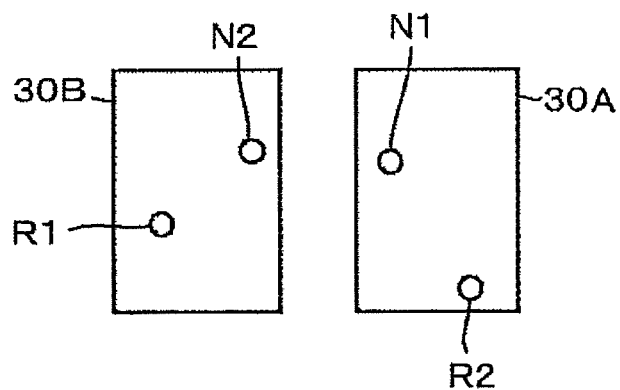
FIG. 47 is an explanatory view illustrating an example of the nozzles installed on the nozzle arms.
Figure 48:
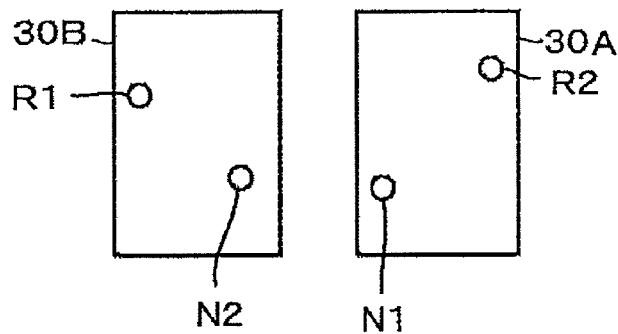
FIG. 48 is an explanatory view illustrating an example of the nozzles installed on the nozzle arms.
Figure 49:
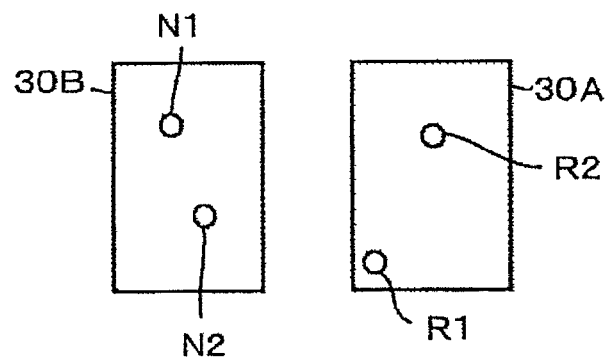
FIG. 49 is an explanatory view illustrating an example of the nozzles installed on the nozzle arms.

Further, FIG. 33 is an example in which the one nozzle arm 30A locates N1, N2 and the other nozzle arm 30B locates R1, R2, and the positions in the Y-direction of both of the nozzle arms 30A, 30B are different. FIG. 33 to FIG. 35 illustrate the states in which both of the nozzle arms 30A, 30B are sequentially moved, and correspond to FIG. 6 to FIG. 8 respectively. Examples of other layouts of R1, R2, N1, N2 for moving both of the nozzle arms 30A, 30B in the X-direction while arranged side by side in the X-direction to obtain the same operation as that in the first embodiment include those in FIG. 36 to FIG. 49.

Figure 50:
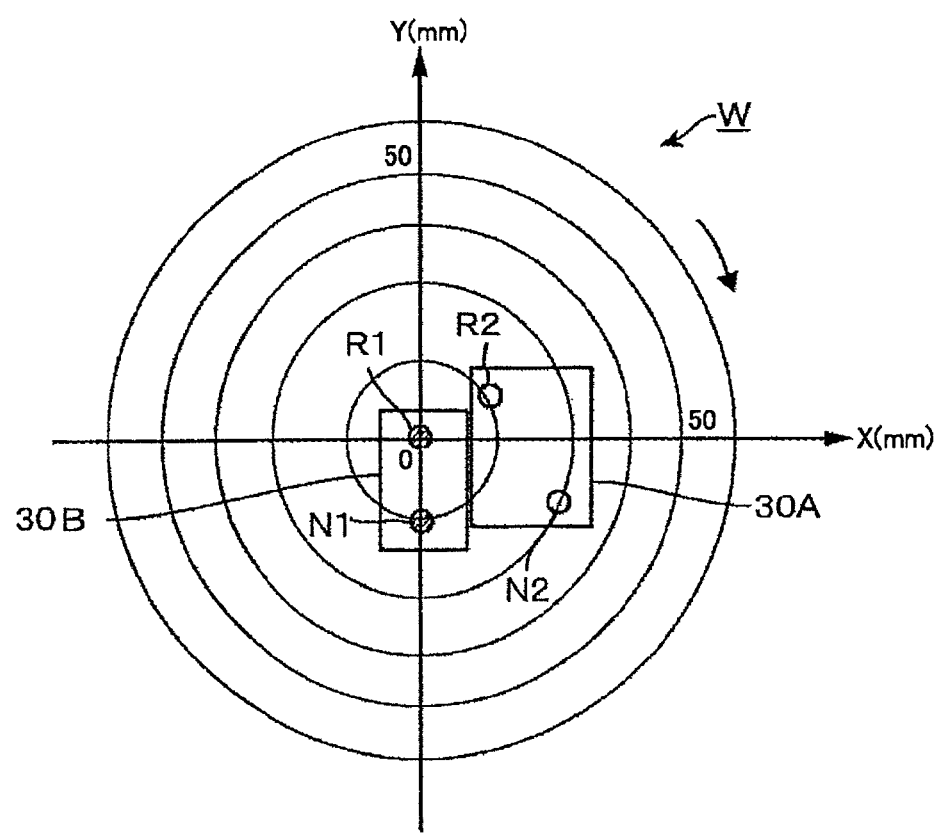
FIG. 50 is an explanatory view illustrating positions of nozzle arms and states of discharges from nozzles in a cleaning process for the substrate.
Figure 51:
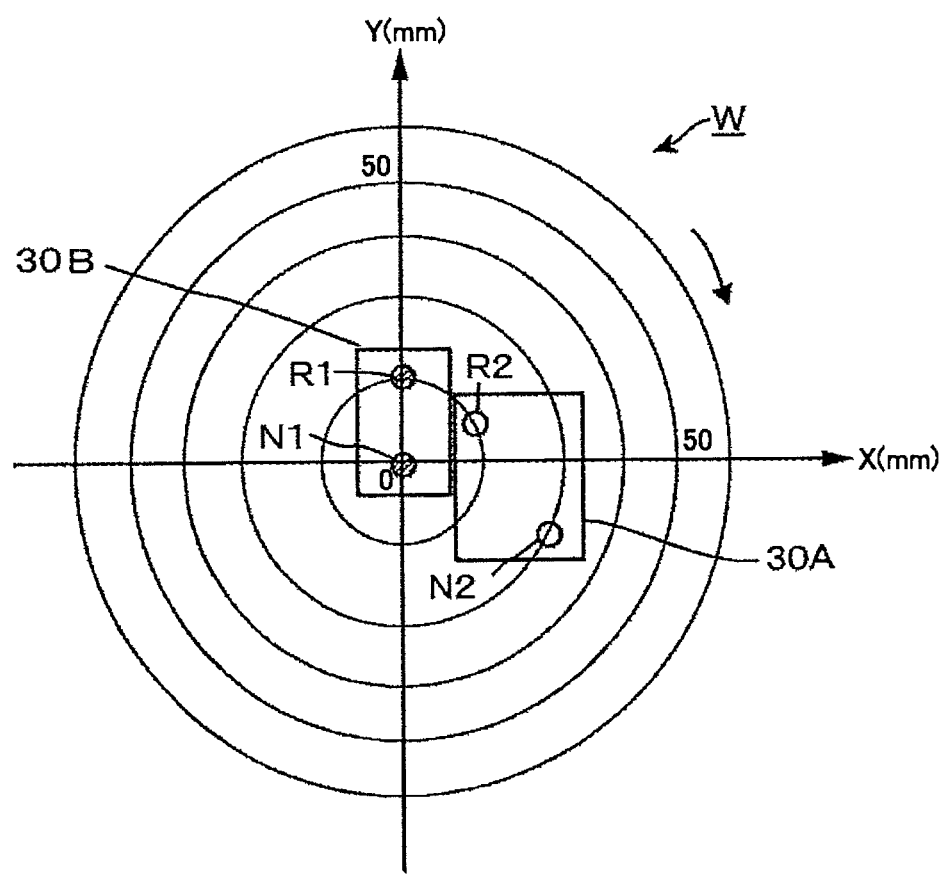
FIG. 51 is an explanatory view illustrating the positions of the nozzle arms and the states of discharges from the nozzles in the cleaning process for the substrate.
Figure 52:
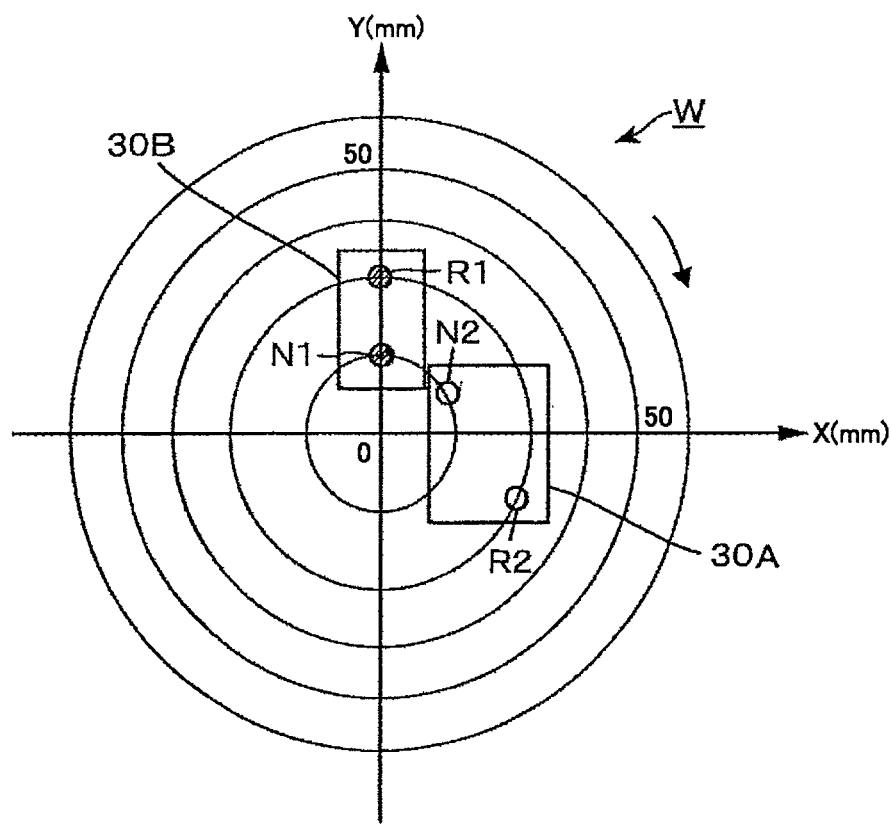
FIG. 52 is an explanatory view illustrating the positions of the nozzle arms and the states of discharges from the nozzles in the cleaning process for the substrate.
Figure 53:
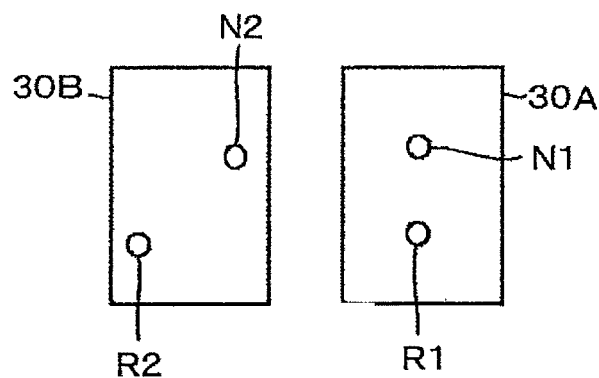
FIG. 53 is an explanatory view illustrating an example of nozzles installed on nozzle arms.
Figure 54:
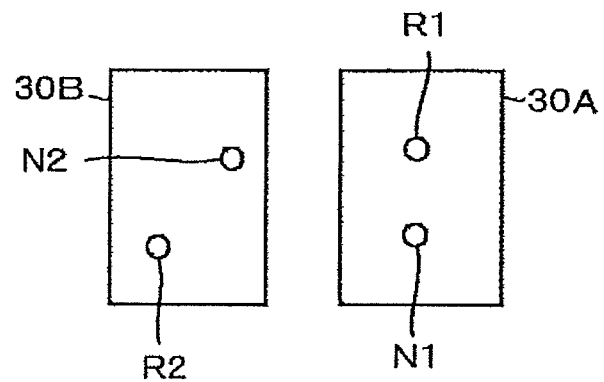
FIG. 54 is an explanatory view illustrating an example of the nozzles installed on the nozzle arms.
Figure 55:
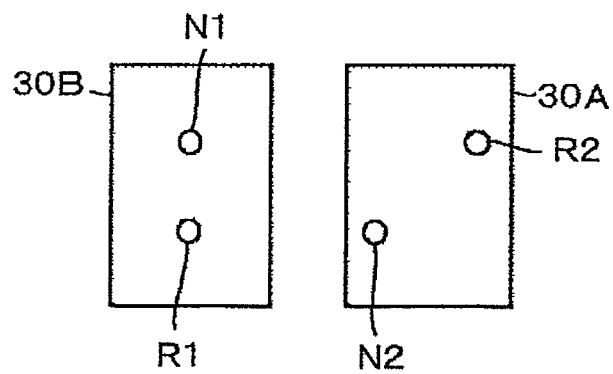
FIG. 55 is an explanatory view illustrating an example of the nozzles installed on the nozzle arms.
Figure 56:
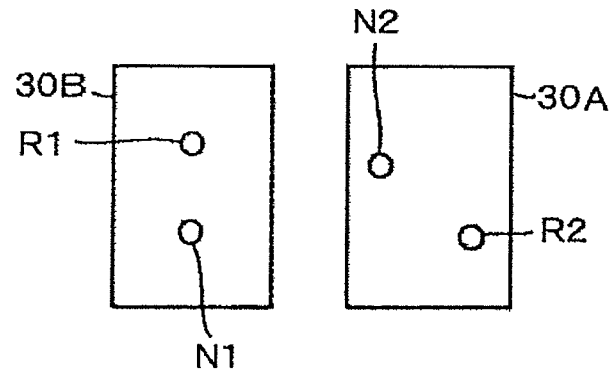
FIG. 56 is an explanatory view illustrating an example of the nozzles installed on the nozzle arms.
Figure 57:
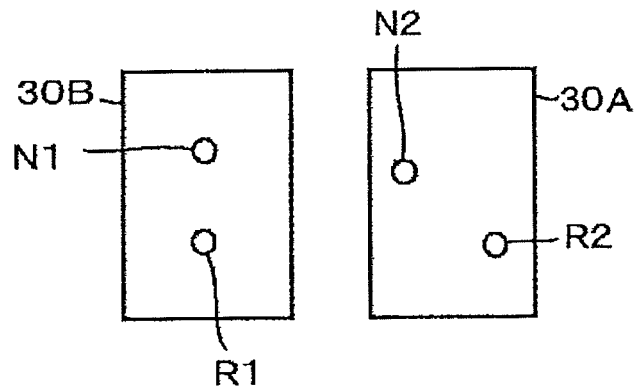
FIG. 57 is an explanatory view illustrating an example of the nozzles installed on the nozzle arms.
Figure 58:
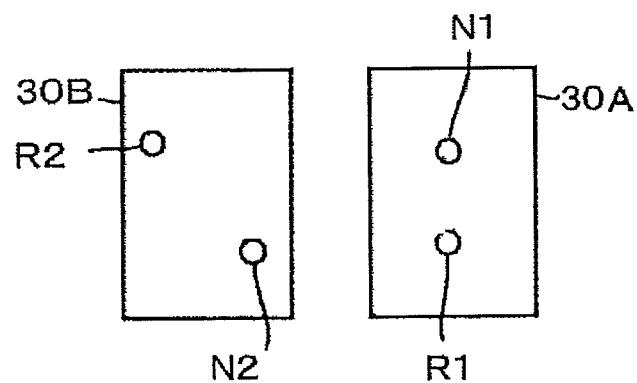
FIG. 58 is an explanatory view illustrating an example of the nozzles installed on the nozzle arms.
Figure 59:
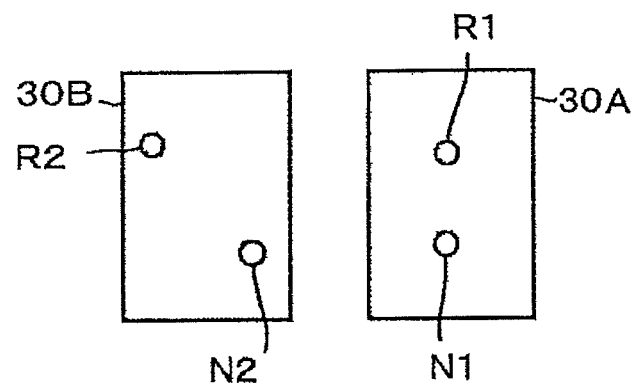
FIG. 59 is an explanatory view illustrating an example of the nozzles installed on the nozzle arms.

FIG. 50 is an example in which the one nozzle arm 30A locates R2, N2 and the other nozzle arm 30B locates R1, N1, and R1, N1 are located apart in the Y-direction. In this case, the one nozzle arm 30B is moved in the Y-direction (a direction perpendicular to the direction in which the guide rail 33 for the nozzle arm 30 extends). FIG. 50 to FIG. 52 illustrate the states that both of the nozzle arms 30A, 30B are sequentially moved, and correspond to FIG. 6 to FIG. 8 respectively. Examples of other layouts of R1, R2, N1, N2 for moving the one of both of the nozzle arms 30A, 30B in the Y-direction and moving the other in the X-direction to obtain the same operation as that in the first embodiment include those in FIG. 53 to FIG. 59.

Figure 60:
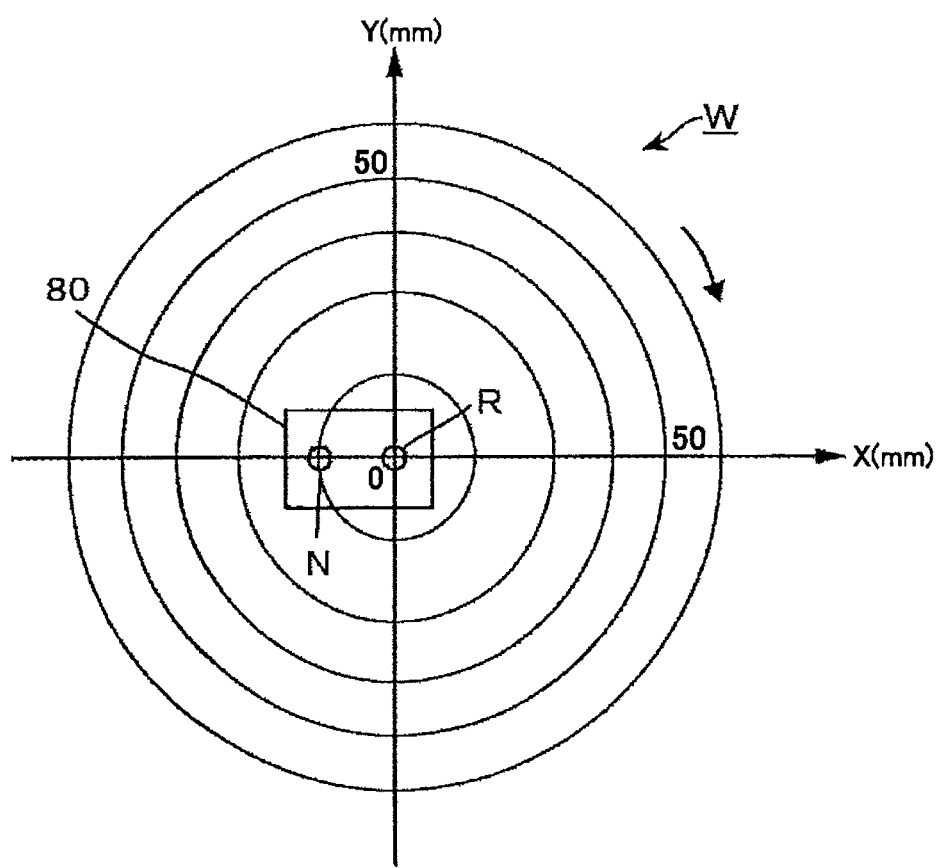
FIG. 60 is an explanatory view illustrating a position of a nozzle arm and states of discharges from nozzles in a cleaning process for the substrate.
Figure 61:
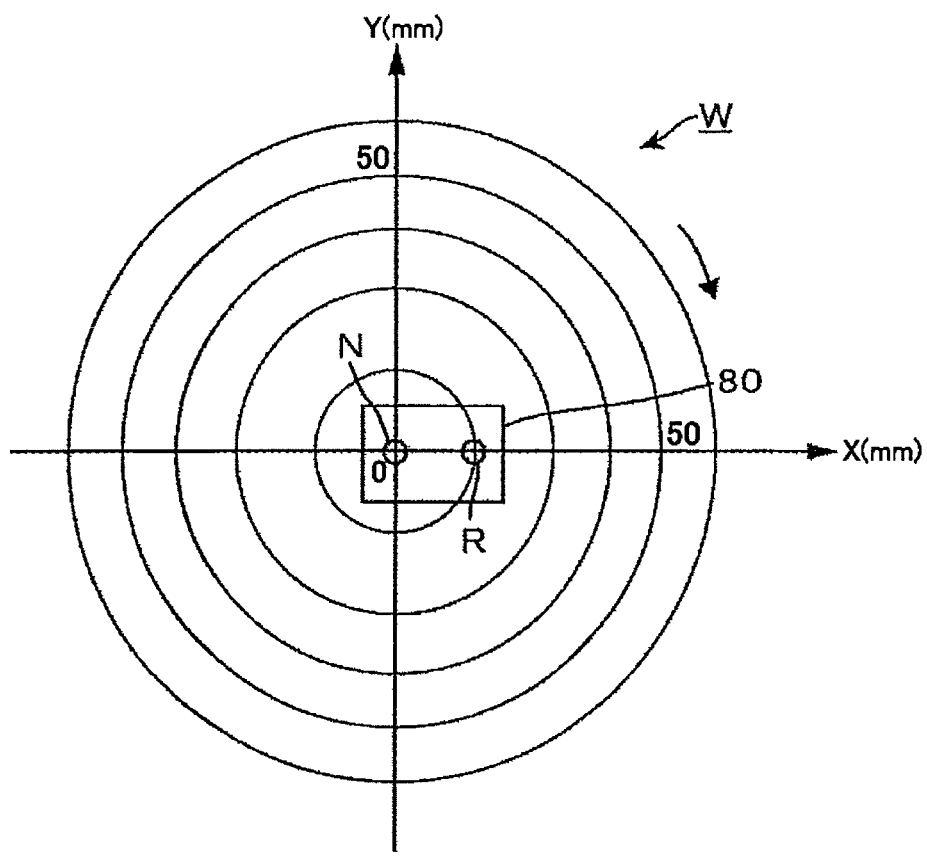
FIG. 61 is an explanatory view illustrating the position of the nozzle arm and the states of discharges from the nozzles in the cleaning process for the substrate.
Figure 62:
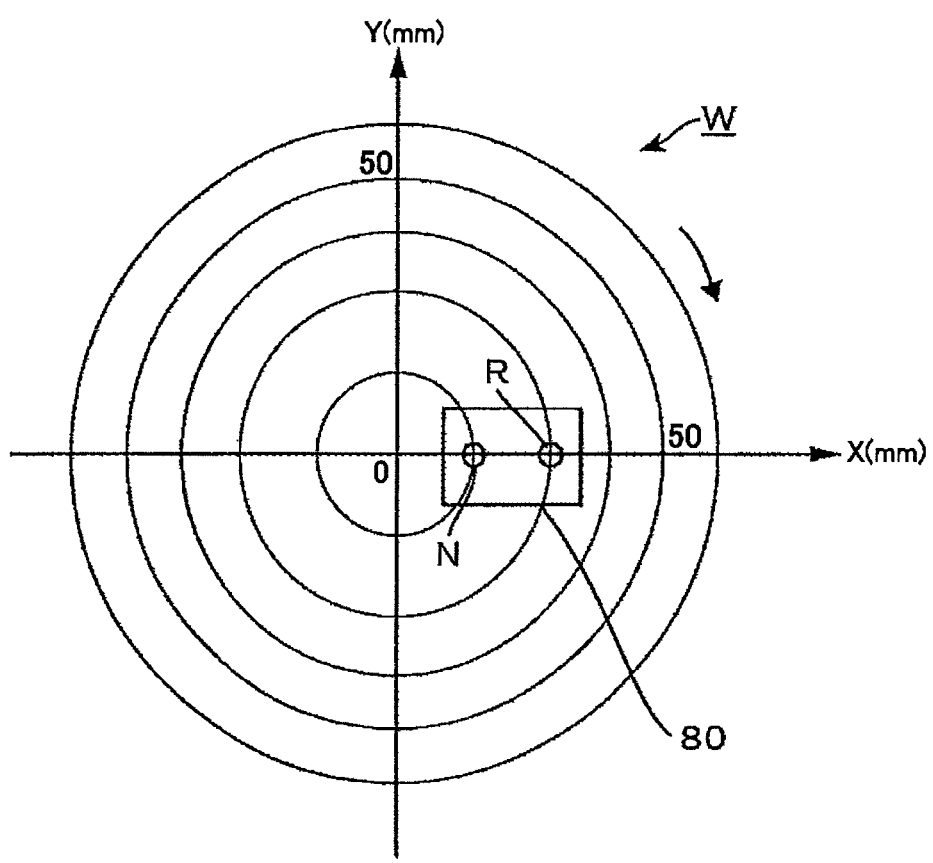
FIG. 62 is an explanatory view illustrating the position of the nozzle arm and the states of discharges from the nozzles in the cleaning process for the substrate.
Figure 63:
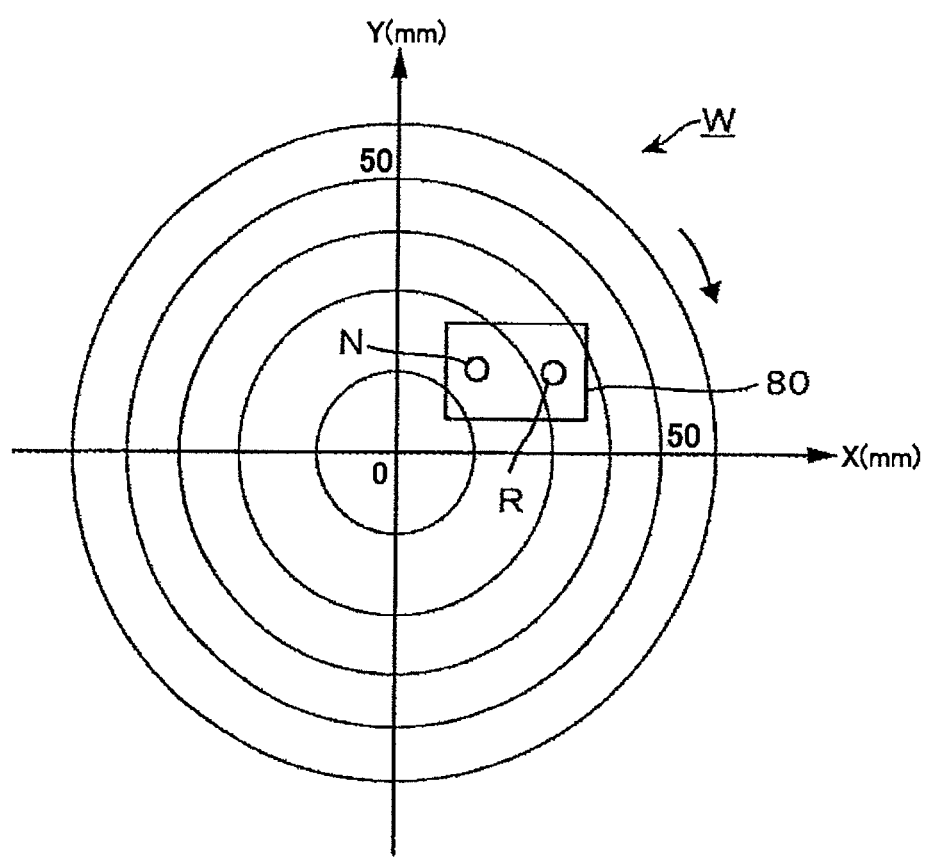
FIG. 63 is an explanatory view illustrating the position of the nozzle arm and the states of discharges from the nozzles in the cleaning process for the substrate.

Further, a technique of obtaining the operation in the first embodiment using one nozzle arm that is movable both in the X-direction and the Y-direction will be described. FIG. 60 is an example in which one cleaning liquid nozzle and one nitrogen gas nozzle are provided on one nozzle arm 80, illustrating the discharge positions of the cleaning liquid nozzle and the nitrogen gas nozzle as N, R respectively. Namely, in this example, R serves as both R1 and R2 and N serves as both N1, N2 by moving the nozzle arm 80 in the X-direction and the Y-direction. FIG. 60 to FIG. 62 illustrate the states that the nozzle arm 80 is sequentially moved, and correspond to FIG. 6 to FIG. 8 respectively. In this example, the one cleaning liquid nozzle whose discharge position is indicated with R serves as the first cleaning liquid nozzle 41 to the position illustrated in FIG. 62 and serves as the second cleaning liquid nozzle 43 at the moving stage from the position illustrated in FIG. 62, and the nozzle arm 80 is moved in the Y-axis direction, for example, as illustrated in FIG. 63.

Figure 64:
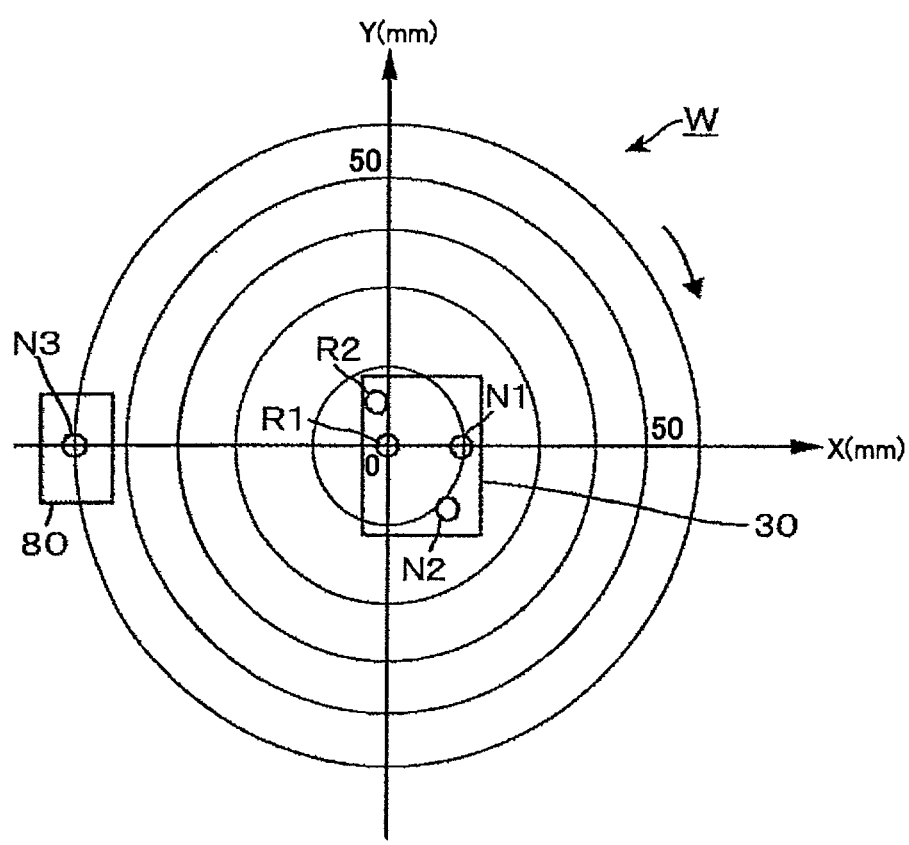
FIG. 64 is an explanatory view illustrating an example of nozzles installed on nozzle arms.

Furthermore, in FIG. 64, two nozzle arms 30, 80 are used and R1, R2, N1, N2 are arranged on the one nozzle arm 30 so that the same operation as that in the first embodiment. Further, the another nitrogen gas nozzle 59 (its discharge position is indicated as N3) described in the second embodiment is provided on the other nozzle arm 80. In this example, the moving pattern of the one nozzle arm 30 is the same as that in the first embodiment, but at the time when N2 is located, for example, at a position of 60 mm from the central portion of the wafer W as described in the second embodiment, N2 is switched to N3. Accordingly, in this case, the moving speed of the other nozzle arm 80 is higher than the moving speed of the one nozzle arm 30 as has been described in the second embodiment. Note that the moving speed of the other nozzle arm 80 may be the same as the moving speed of the one nozzle arm 30.

Figure 65:
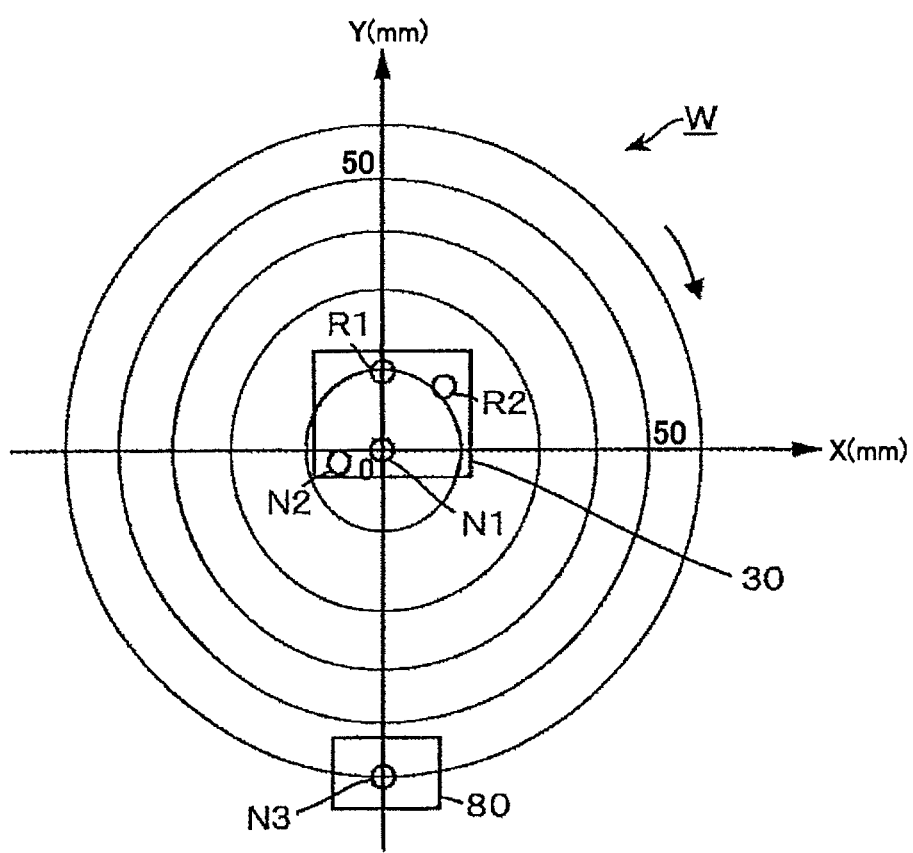
FIG. 65 is an explanatory view illustrating the example of the nozzles installed on the nozzle arms.
Figure 66:
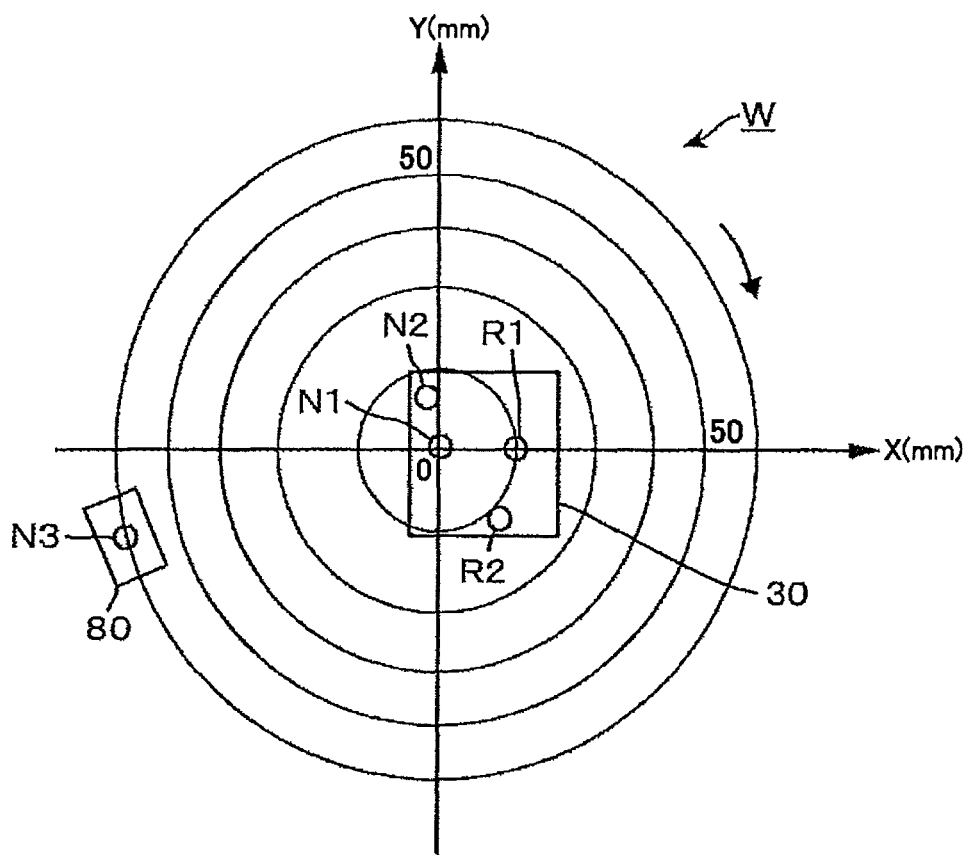
FIG. 66 is an explanatory view illustrating the example of the nozzles installed on the nozzle arms.

The example in FIG. 64 is an example in which the nozzle arms 30, 80 are moved in the X-direction, and when the nozzle arms 30, 80 are moved in the Y-direction, the layout of R1, R2, N1, N2, N3 is illustrated in FIG. 65. Further, when the nozzle arms 30, 80 are rotated as illustrated as the modified example of the first embodiment, the layout of R1, R2, N1, N2, N3 is illustrated as in FIG. 66.

Example 1

To evaluate the present invention, the substrate cleaning apparatus according to the first embodiment was used to supply a developing solution to a wafer W exposed using an evaluation pattern and perform the cleaning treatment according to Example and Comparative Example, and defects of pattern were counted. The contact angle difference between the resist film and the anti-reflection film formed on the front surface of the wafer W used in Example is 37.8°. The rotation speed of the wafer during the cleaning treatment was set to 750 rpm, and the moving speed of the nozzle arm 30 was set to 10 mm/sec. Further, as Comparative Example, the substrate cleaning apparatus in the same configuration as that in Example was used to perform cleaning of the wafer by moving the nozzle arm 30 along the X-direction toward the peripheral edge of the wafer W while discharging the first cleaning liquid and the first nitrogen gas toward the wafer without switching the cleaning liquid nozzle and the nitrogen gas nozzle after completion of Step 2. In this case, the distance from the discharge position of the gas to the liquid interface is constant. 2561 pattern defects were confirmed in Comparative Example, whereas the number of pattern defects was reduced to 8, whereby the high cleaning effect of the present invention was confirmed.

[Evaluation Test]

To investigate the influence provided by the separation distance between the discharge position of the nitrogen gas and the liquid interface of the cleaning liquid on the effect of cleaning the wafer W, the following evaluation test was carried out. The substrate cleaning apparatus in which the distance between the liquid interface and the discharge position of the nitrogen gas was set in 7 patterns as follows by changing the position of the first nitrogen gas nozzle 51 installed on the nozzle arm 30, performed cleaning using only the first cleaning liquid nozzle 41 and the first nitrogen gas nozzle 51 after the developing solution was supplied to the exposed wafer W using the evaluation pattern. After the cleaning of the wafer W, dry treatment was carried out, and the number of pattern defects existing in a region of 12 cm to 15 cm from the central portion of the wafer was counted. The result is as listed in Table 1.

TABLE 1

| | Separation distance | | | | | | |
|---|---|---|---|---|---|---|---|
| | 7 mm | 9 mm | 11 mm | 13 mm | 15 mm | 17 mm | 19 mm |
| Pattern defect | 264 | 6 | 8 | 5 | 13 | 10 | 52 |

To sufficiently suppress the number of pattern defects, it can be desirable to set the distance between the nitrogen gas discharge position and the liquid interface in a range of 9 mm to 17 mm.

Example 2

To evaluate the present invention, the substrate cleaning apparatus according to the first embodiment was used to supply a developing solution to a wafer W exposed using an evaluation pattern and perform the cleaning treatment with the height of the tip portion of the first nitrogen gas nozzle 51 to 25 mm and 5 mm above the wafer W, and a pattern was formed and the surface of the wafer W was investigated. Residue defects (development defects) within 3 cm from the central portion of the wafer W were counted. The number of defects when the height of the tip portion of the first nitrogen gas nozzle 51 was set at 25 mm above the wafer W was 8, and the number of defects when the height of the tip portion of the first nitrogen gas nozzle 51 was set at 5 mm above the wafer W was 3. It can be said that setting the height of the tip portion of the first nitrogen gas nozzle 51 to low makes it possible to decrease the liquid remnant in the vicinity of the central portion of the wafer W.

Example 3

To investigate the influence provided by the distance between the discharge position of the nitrogen gas discharged at an angle of 45 degrees with respect to the horizontal plane and the liquid interface of the cleaning liquid on the effect of cleaning the wafer W, the following evaluation test was carried out. In the substrate cleaning apparatus, the second nitrogen gas nozzle 53 installed on the nozzle arm 30 was provided at an angle of 45 degrees from the horizontal plane and the installation position was moved to the center side of the wafer W. When the distance between the discharge position N2 of the second nitrogen gas nozzle 53 and the liquid interface of the cleaning liquid was set to three patterns of A mm, A+1 mm, A+2 mm, the number of defects in the case of the distance of A+1 mm was about three times that of A mm, and the number of defects in the case of A+2 mm was about six times. Accordingly, it is understood that changing the distance changes the cleaning effect.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention.

What is claimed is:

1. A substrate cleaning method of cleaning a substrate using a cleaning liquid and a gas while rotating the substrate, comprising the steps of:

horizontally holding the substrate on a substrate holding unit;

discharging the cleaning liquid from a first cleaning liquid nozzle to a central portion of the substrate while rotating the substrate holding unit around a vertical axis;

then moving a discharge position of the cleaning liquid to a peripheral edge side of the substrate and thereafter discharging the gas from a gas nozzle to the central portion of the substrate;

subsequently moving discharge positions of the first cleaning liquid nozzle and the gas nozzle toward the peripheral edge side of the substrate while discharging the cleaning liquid and the gas from the first cleaning liquid nozzle and the gas nozzle respectively; and then switching discharge of the cleaning liquid from the first cleaning liquid nozzle to a second cleaning liquid nozzle, and moving discharge positions of the second cleaning liquid nozzle and the gas nozzle toward the peripheral edge side of the substrate while discharging the cleaning liquid from the second cleaning liquid nozzle and discharging the gas from the gas nozzle, wherein the discharge position of the second cleaning liquid nozzle is set at a position deviated from a movement locus of the discharge position of the first cleaning liquid nozzle, and wherein where a distance from the discharge position of the second cleaning liquid nozzle to the central portion of the substrate is d2, and a distance from the discharge position of the gas nozzle to the central portion of the substrate is d3, when the cleaning liquid is being discharged from the second cleaning liquid nozzle, d3<d2 and a difference between d2 and d3 gradually decreases with movement of the second cleaning liquid nozzle to the peripheral edge side of the substrate.

2. The substrate cleaning method as set forth in claim 1, wherein the first cleaning liquid nozzle, the second cleaning liquid nozzle, and the gas nozzle are provided on a common nozzle moving unit.

3. The substrate cleaning method as set forth in claim 1, wherein a nozzle moving unit provided with at least one of the first cleaning liquid nozzle, the second cleaning liquid nozzle, and the gas nozzle is movable separately and independently from a nozzle moving unit provided with other of the nozzles.

4. The substrate cleaning method as set forth in claim 1, wherein the gas nozzle comprises a first gas nozzle that is used when discharging the gas to the central portion of the substrate, and a second gas nozzle that is provided at a position deviated from a movement locus of the first gas nozzle and is used when moving the discharge positions of the cleaning liquid and the gas to the peripheral edge side of the substrate while discharging the cleaning liquid from the second cleaning liquid nozzle.

5. The substrate cleaning method as set forth in claim 4, wherein a discharge flow rate of the gas at the second gas nozzle is set to be larger than a discharge flow rate of the gas at the first gas nozzle.

6. The substrate cleaning method as set forth in claim 1, wherein the substrate held on the substrate holding unit is a substrate that has been exposed using a resist film having a water contact angle of 65 degrees or more and thereafter supplied with a developing solution.

* * * * *